(12) United States Patent
Rodgers et al.

(10) Patent No.: US 10,386,429 B2
(45) Date of Patent: Aug. 20, 2019

(54) SYSTEMS AND METHODS FOR THE SELECTIVE MAPPING OF WATER T1 RELAXATION TIMES

(71) Applicant: Oxford University Innovation Limited, Oxford (GB)

(72) Inventors: Christopher T. Rodgers, Oxford (GB); Liam D. Garrison, Oxford (GB)

(73) Assignee: Oxford University Innovation Limited (GB)

(*) Notice: Subject to any disclaimer, the term of this patent is extended or adjusted under 35 U.S.C. 154(b) by 205 days.

(21) Appl. No.: 15/731,120

(22) Filed: Apr. 21, 2017

(65) Prior Publication Data

US 2017/0307699 A1  Oct. 26, 2017

Related U.S. Application Data

(60) Provisional application No. 62/391,202, filed on Apr. 22, 2016.

(51) Int. Cl.

| G01R 33/24 | (2006.01) |
| G01R 33/48 | (2006.01) |
| G01R 33/3875 | (2006.01) |
| G01R 33/565 | (2006.01) |
| G01R 33/50 | (2006.01) |
| G01R 33/56 | (2006.01) |
| G01R 33/20 | (2006.01) |
| G01V 3/00 | (2006.01) |
| G01R 33/561 | (2006.01) |

(52) U.S. Cl.
CPC ........ *G01R 33/24* (2013.01); *G01R 33/3875* (2013.01); *G01R 33/4828* (2013.01); *G01R 33/50* (2013.01); *G01R 33/5607* (2013.01); *G01R 33/56527* (2013.01); *G01R 33/20* (2013.01); *G01R 33/5614* (2013.01); *G01V 3/00* (2013.01)

(58) Field of Classification Search
CPC .............. G01R 33/24; G01R 33/4828; G01R 33/3875; G01R 33/56527; G01R 33/50; G01R 33/5607
See application file for complete search history.

(56) References Cited

U.S. PATENT DOCUMENTS

| 7,924,002 B2* | 4/2011 | Lu ............... G01R 33/243 324/307 |
| 7,952,353 B2* | 5/2011 | Lu ............... G01R 33/243 324/307 |
| 9,030,201 B2* | 5/2015 | Rehwald ........ G01R 33/4828 324/307 |
| 2009/0174403 A1* | 7/2009 | Lu ............... G01R 33/243 324/307 |
| 2010/0283463 A1* | 11/2010 | Lu ............... G01R 33/243 324/309 |

* cited by examiner

*Primary Examiner* — Dixomara Vargas
(74) *Attorney, Agent, or Firm* — Thomas|Horstemeyer, LLP

(57) ABSTRACT

Described herein are systems and methods for the selective mapping of water T1 relaxation times.

20 Claims, 23 Drawing Sheets
(18 of 23 Drawing Sheet(s) Filed in Color)

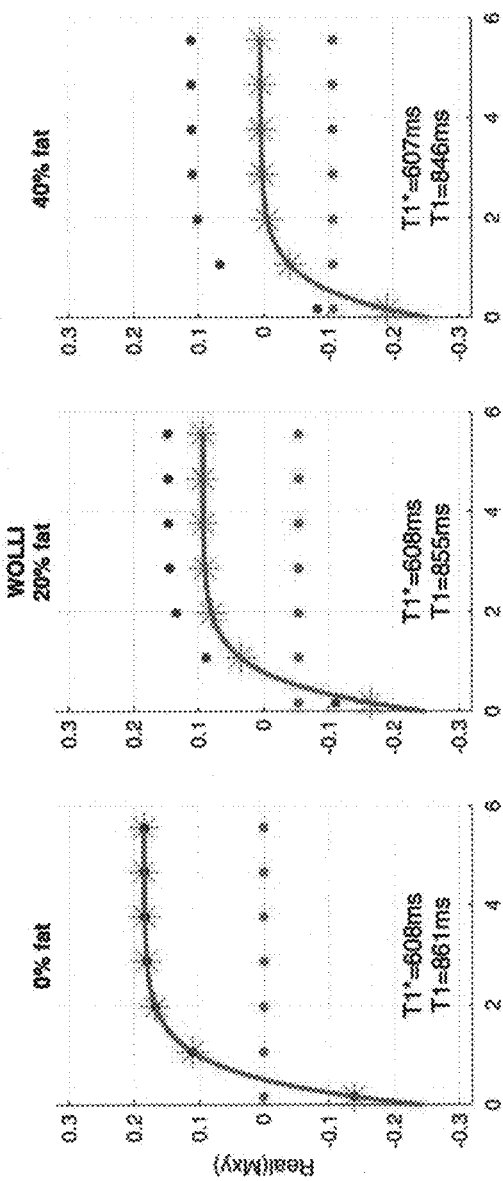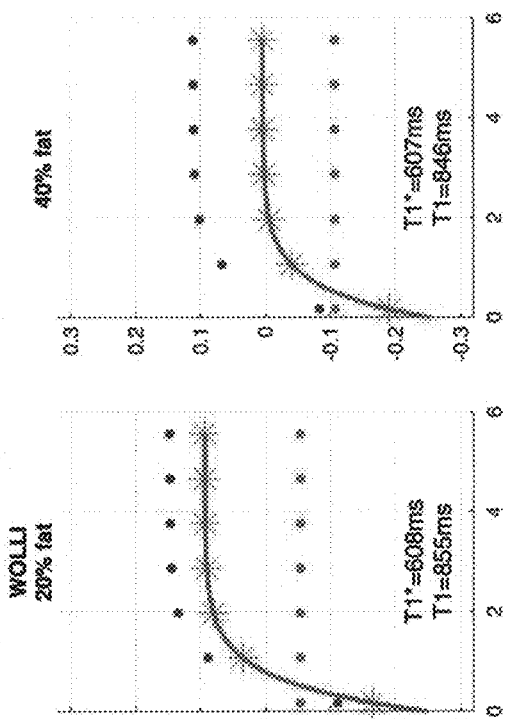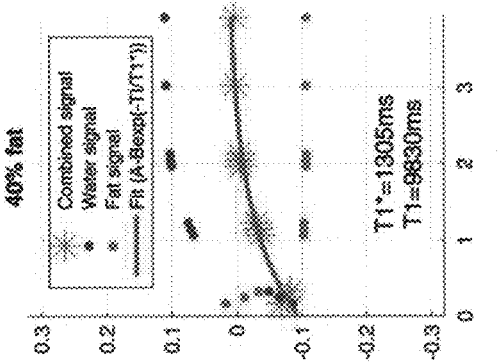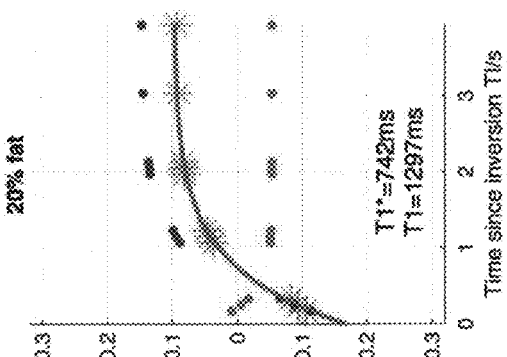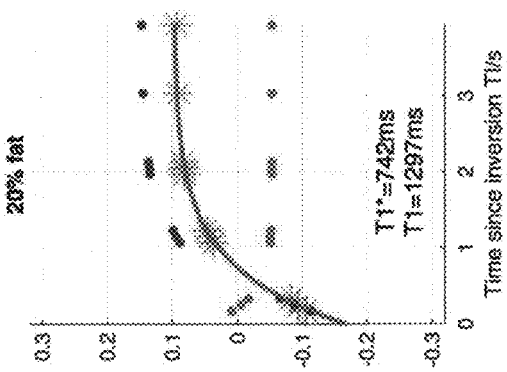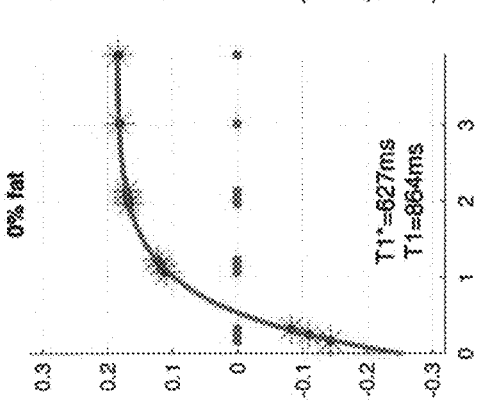

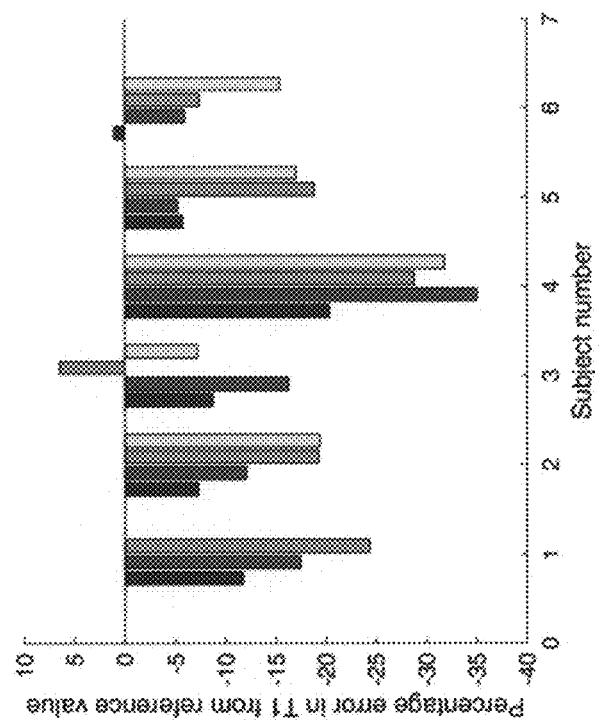
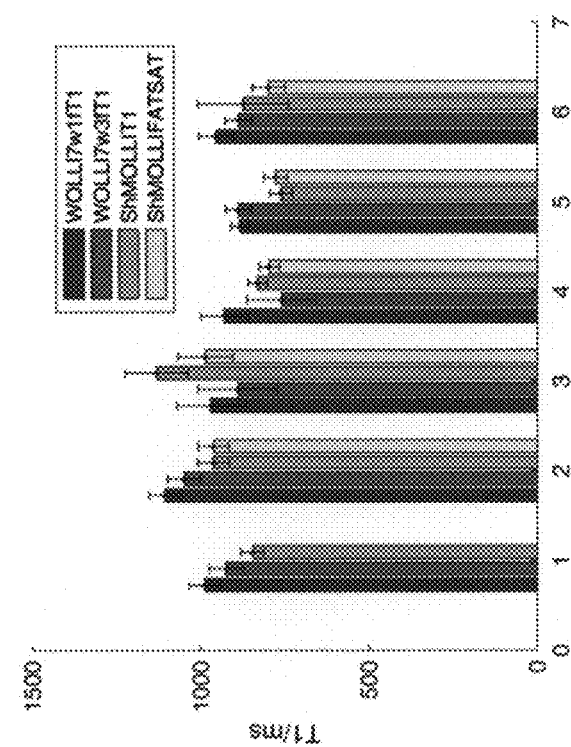
Fig. 11(a)
Fig. 11(b)

SYSTEMS AND METHODS FOR THE SELECTIVE MAPPING OF WATER T1 RELAXATION TIMES

CROSS-REFERENCE TO RELATED DOCUMENTS

This application claims priority to and the benefit of provisional application entitled "SYSTEMS AND METHODS FOR THE SELECTIVE MAPPING OF WATER T1 RELAXATION TIMES," having Ser. No. 62/391,202, filed Apr. 22, 2016, which is incorporated herein by reference in its entirety.

This application makes reference to and incorporates by reference the following papers appended hereto if they were fully set forth herein expressly in their entirely.

Water-Only Look-Locker Inversion recovery (WOLLI) $T_1$ mapping, attached hereto as Appendix A. Water-Only Look-Locker Inversion Recovery (WOLLI) $T_1$ Mapping (Power Point), attached hereto as Appendix B. Water-Only Look-Locker Inversion recovery (WOLLI) $T_1$ mapping (Abstract), attached hereto as Appendix C.

TECHNICAL FIELD

The present disclosure generally relates to medical imaging and, more particularly, relates to systems and methods for the selective mapping of water T1 relaxation times.

BACKGROUND

Magnetic resonance (MR) imaging is a common non-invasive imaging modality useful for structural and functional imaging of living subjects. Subjects to be imaged (or scanned) are placed in or adjacent to a scanner, a magnetic field is applied, and one or more RF pulses are generated that excite and align proton spins. Following the RF pulse(s), protons relax, generating RF emissions that are detected by receivers in the scanner, and an image is generated.

MR images are dependent on a combination of intrinsic tissue properties such as spin-lattice (T1) and spin-spin (T2) relaxation times, and extrinsic properties such as imaging strategies and settings used to adjust tissue contrast in the resulting image. Images can be weighted according to T1 signal, T2 signal, or a combination thereof depending on the desired image output. Signal intensity in conventional MR images is displayed on an arbitrary scale, and thus is not adequate for direct comparisons.

Measuring maps of tissue T1 relaxation time in the human body (liver, heart, spleen, pancreas, blood, or skeletal muscle for example) using MRI scanners is a growing area. Tissue T1 indirectly probes tissue microstructure and "T1-mapping" is a powerful approach that can be used to characterize tissue in the human body in vivo. A major advantage of myocardial T1-mapping, for example, is scanner- and operator-independent quantification of structural changes that are largely independent of imaging parameters. Independence from imaging parameters allows for objective comparisons between examinations.

T1 relaxation times depend on the composition of tissues. T1 relaxation times exhibit characteristic ranges of normal values at a selected magnetic field strength. Deviation from established ranges can thus be used to quantify the effects of pathological processes and T1 changes in different organs have been associated with a variety of pathologies. In the heart for example, longitudinal relaxation time T1 changes can reveal edema (1), myocardial infarction (2) and fibrosis (3). T1-mapping may be a sensitive technique for detecting diffuse fibrosis in heart failure and valvular heart disease, which have been described by abnormal post-contrast T1 values but not by conventional late gadolinium enhanced (LGE) imaging. In the liver, T1 mapping detects the onset of fibrosis or cirrhosis more sensitively than conventional needle biopsy (4).

Pulse sequences such as modified Look-Locker inversion recovery (MOLLI) (5), shortened modified Look-Locker inversion recovery (ShMOLLI—sometimes also known as (Sh)MOLLI, although the latter can refer to MOLLI and ShMOLLI together) (6) and saturation recovery single-shot acquisition (SASHA) (7) are known for T1 mapping in the human body. Indeed, large multi-center studies (8) are now starting to use T1 mapping as an endpoint, namely a final measurement of a clinical study, experiment, clinical treatment or the like that can be used for validation, for example validation of a scientific hypothesis or determination of treatment efficacy.

One method for performing myocardial T1-mapping is the modified Look Locker inversion recovery (MOLLI) pulse sequence. With reference to FIG. 1, MOLLI merges single-shot images from three consecutive inversion-recovery (IR) epochs into one data set to give more TI samples than would otherwise be possible in one breath hold. A three-parameter fit then generates a single-slice T1 map of the myocardium.

The water T1 reflects tissue microstructure because it is effectively an indirect measure of the size of cells and the ratio of the volumes of water in the intracellular and extracellular pools. In disease, changes in tissue microstructure, such as increased interstitial volume due to edema or rupture of cell membranes after infarction, can therefore alter the water T1 value. Unfortunately, in organs such as the liver, disease progression is often associated with the formation of substantial intracellular lipid droplets, producing tissue fat fractions of up to 40% (9,10). Many current T1-mapping methods do not discriminate between water and fat when performing the inversion (or saturation) and readout. For example, MOLLI T1 values deviate substantially from the water T1 in voxels that contain a mixture of fat and water. This means that the observed T1 (T1*) may not reflect the water T1, and therefore may not reflect the expected features of the tissue microstructure: cell size, interstitial volume, etc.

Furthermore, the steady-state free precession (SSFP) readout used in MOLLI, ShMOLLI and SASHA with typical parameters at 3T, leads to opposite phase signals from fat and water. (This is illustrated for a single SSFP image in FIG. 13, and for the signals in a typical MOLLI sequence in FIGS. 5(d)-5(f), discussed below). This means that MOLLI, ShMOLLI and SASHA can significantly underestimate or overestimate the water T1 depending on the fraction of fat in a voxel. (11,12) Surprisingly, these effects can complicate the interpretation of MOLLI, ShMOLLI and SASHA results even in tissue that contains as little as 5% fat fraction.

While T1 mapping is of growing importance, fat signals can also create artifacts and image distortion, even when present in small fractions. The separation of fat and water, as well as suppression of fat signals, in homogenous and non-homogenous magnetic fields is an important issue in MRI with room for improvement. New approaches are needed to selectively measure the water T1 in tissue such as a diseased liver, in order to continue to probe tissue microstructure even when there are many lipid droplets. Accordingly, there is a need to address the aforementioned deficiencies and inadequacies.

SUMMARY

The present disclosure provides systems and methods for the selective mapping of water T1 relaxation times. They can address and overcome the aforementioned issues regarding fat signals. In an embodiment, the mapping of water T1 relaxation can be water-selective Look-Locker inversion recovery (WOLLI) T1 relaxation time mapping. In various aspects, an inversion-recovery pulse sequence can be used to selectively invert water with no effect on fat and then correct the observed water T1* value to give a true water T1. The pulse sequence can selectively invert the water content of the tissue being imaged, then can acquire a series of single-shot images at a user-specified set of delay times (TI). A fat suppressed image incorporating T1*-T1 correction methods can then be acquired in order to determine the steady-state water signal.

In an aspect, a fat suppressed image can be acquired by generation of a fat-selective inversion pulse. The fat suppressed image can be acquired in combination with imaging and post-hoc correction. Alternatively, instead of acquiring a fat suppressed image, a series of images following fat selective inversions can be acquired in the ensuing heart-beats in order to determine the steady-state water signal. The observed T1* of water (from the water-selective inversion) and the steady-state water signal (from the fat-suppressed image or from the fat selective inverted images) can be combined to determine the T1 of water in each voxel. The methods herein can optionally be gated to a cardiac or respiratory cycle, and can be implemented during a breath hold of a subject in a scanner.

In an embodiment of the present disclosure, provided is a water-selective Look-Locker inversion recovery variant of MOLLI that can measure water T1 irrespective of the presence of partial volume of fat, that is herein referred to as "water-only Look Locker inversion recovery" (WOW). In various aspects, a pulse sequence can be activated to perform water-selective inversion (with minimal perturbation of the fat). The water-selective inversion recovery experiment can include single-shot Steady-State Free Precision (SSFP) readouts. The single-shot SSFP readouts can be at different delay times (TI). In order to perform the correction to obtain water T1 from water observed relaxation time T1*, either: (a) a pulse sequence to perform fat-suppression or (b) a pulse sequence to perform a series of one or more fat-selective inversion recoveries can be activated immediately after the single-shot SSFP readouts following the water selective inversion pulse. Both options can be activated from the driven steady-state resulting from the water selective inversion recovery epoch. The driven steady state can be the water inversion recovery period immediately preceding the fat suppression or inversion recovery. The fat-suppression pulse (option (a) above) can be a fat-selective inversion pulse activated at $TI=\ln(2) \times T1f^*$ before a final single-shot SSFP readout such that the fat magnetization is zero and the water magnetization is at the driven steady-state (ie $A_w$, described in more detail below) (this approach to fat suppression is sometimes termed chemical shift-selective inversion recovery (CSS-IR) (13)). Prior knowledge of the (approximate) fat $T1f^*$ is can be used for this approach. Alternatively, if the fat-selective inversion recovery pulse sequence (option (b) above) can be used, the water steady-state magnetization can be determined without using a pre-determined fat $T1f^*$. Observed water recovery ("water T1*" or "T1w*") can then be corrected to extract a true water T1 (or "T1w").

In an embodiment, a method for performing water-selective spin-lattice (T1) mapping is disclosed, which can be a computer implemented method. To implement the method, a pulse that selectively inverts water can be activated by at least one computing device to perform an inversion-recovery (IR) experiment. A plurality of single-shot images at various intervals can then be gathered comprising together a first "water-inversion epoch". In one or more aspects, the plurality of single-shot images can be gathered at pre-determined intervals. Cartesian SSFP, Radial SSFP, FLASH or many other advanced types of single-shot imaging can also be used. Following acquisition of the last image in a water-inversion epoch, the driven-steady-state water signal can be determined by activating the at least one computing device to record either: (a) a fat-suppressed image, e.g. by fat-selective inversion and waiting a delay. In an aspect, the delay can be $TI \approx \ln(2) \times T1^*f$ for the fat magnetization to reach zero before recording a single-shot SSFP image; or (b) a fat-inversion epoch by a set of fat-selective inversion pulses and single-shot readouts analogous to the water-selective epoch described above. The intervals can be based on a heartbeat interval, otherwise gated, or at fixed times as appropriate for the organ being imaged. The plurality of single-shot SSFP images can comprise, for example, a 5-sample data set, a 7-sample data set, or an 8-sample data set.

In any one or more of the aforementioned embodiments and aspects, one or more of the inversion pulses can be a pulse having an asymmetric frequency profile. For example, the inversion pulse can be a hypergeometric pulse (14). Alternatively, an optimal control pulse, Shinnar-Le Roux (SLR) pulse, or other optimized pulse could be used.

The above embodiments and aspects can optionally be coupled to additional water-inversion epochs, or fat-inversion epochs, or fat-suppressed images. Suitable strategies for a given application can depend upon, for example, the amount of time available for recording each water T1 map and the desired signal-to-noise ratio (SNR) of the resulting water T1 map. It can optionally be coupled to other experiments such as MOLLI, (Sh)MOLLI, or others, with or without contrast agents following the recovery period.

In an embodiment, a computer implemented method for selective mapping of water T1 relaxation times in a subject is provided. The method can comprise: i. activating one or more water-selective inversion pulses that selectively invert water magnetization in a region of interest in the subject, by at least one computing device, to perform a water-selective inversion-recovery (IR) experiment; ii. acquiring during the water-selective inversion-recovery (IR) experiment a plurality of images at differing intervals relative to the beginning of the acquisition to obtain an observed water T1* map; iii. activating one or more fat-selective inversion pulses that selectively invert fat magnetization in the region of interest in the subject, by at least one computing device, to perform a fat-selective inversion-recovery (IR) experiment; iv. acquiring during the fat-selective inversion-recovery (IR) experiment one or more images at differing intervals relative to the beginning of the acquisition to obtain either (a) a fat-suppressed image of water in driven steady-state; or (b) observed fat T1* and $A_f$ maps; v. determining from the water-selective inversion-recovery (IR) experiment and the fat-selective inversion-recovery (IR) experiment the steady-state contribution for water in the images acquired in steps ii) and iv); and vi. correcting, using the steady-state contribution for water determined in step v), the plurality of images to obtain a water T1 map of the region of interest. The subject can be an animal subject. In particular, the subject can be an animal subject in which a fat suppressed signal may be desired in order to obtain or determine a corrected water value or a true water T1. The subject can be a mammalian subject, such as a human subject.

In an embodiment, a system is provided. The system can implement selective mapping of water T1 relaxation times in a subject. The system can comprise: at least one computing device; at least one application executable in the computing device, the at least one application comprising logic that: i. activates one or more water-selective inversion pulses that selectively invert water magnetization in a region of interest in the subject to perform a water-selective inversion-recovery (IR) experiment; ii. acquires during the water-selective inversion-recovery (IR) experiment a plurality of images at differing intervals relative to the beginning of the acquisition to obtain an observed water T1* map; iii. activates one or more fat-selective inversion pulses that selectively invert fat magnetization in the region of interest in the subject to perform a fat-selective inversion-recovery (IR) experiment; iv. acquires during the fat-selective inversion-recovery (IR) experiment one or more images at differing intervals relative to the beginning of the acquisition to obtain either (a) a fat-suppressed image of water in driven steady-state; or (b) observed fat T1* and $A_f$ maps; v. determines from the water-selective inversion-recovery (IR) experiment and the fat-selective inversion-recovery (IR) experiment the steady-state contribution for water in the images acquired in steps ii) and iv); and vi. corrects, using the steady-state contribution for water determined in step v), the plurality of images to obtain a water T1 map of the region of interest.

In any one or more aspects of any one or more of the embodiments herein, the water-selective inversion pulse can be a pulse with an asymmetric frequency profile, or the fat-selective inversion pulse can be a pulse with an asymmetric frequency profile, or both. The one or more water-selective inversion pulses can include a hypergeometric pulse, an optimal control pulse, or a Shinnar-Le Roux pulse, or the one or more fat-selective inversion pulses can include a hypergeometric pulse, an optimal control pulse, or a Shinnar-Le Roux pulse, or both. The one or more water-selective inversion pulses that selectively invert water magnetization can have negligible effects on fat magnetization, or the one or more fat-selective inversion pulses that selectively invert fat magnetization can have negligible effects on water magnetization, or both. The one or more images acquired during step ii), or the one or more images acquired during step iv), or both, can be one or more single-shot images. The one or more single-shot images can be single-shot Cartesian SSFP images, Radial SSFP images, Spiral SSFP images, other types of SSFP images, or FLASH images, or EPI images, or other types of single-shot magnetic resonance images. The one or more of said water-selective inversion pulses can have an inversion efficiency of about −0.90 to about −1.00 over a range of frequencies covering the water resonance, or one or more of said fat-selective pulses can have an inversion efficiency of about −0.90 to about −1.00 over a range of frequencies covering the fat resonance, or both. The one or more water-selective inversion pulses can have an inversion efficiency of about −0.90 to about −1.00 over a range of frequencies around the central water resonance frequency ($v_{water}$) covering from $v_{water}-\gamma \Delta B_0$ to $v_{water}+\gamma \Delta B_0$, and said one or more fat-selective inversion pulses can have an inversion efficiency of about −0.90 to about −1.00 over a range of frequencies around the central fat resonance frequency ($v_{fat}$) covering from $v_{fat}-\gamma \Delta B_0$ to $v_{fat}+\gamma \Delta B_0$. The last of the plurality of images of step iv) can be acquired about the time during the fat-selective inversion recovery epoch that the fat longitudinal magnetization relaxes to about Mz=0. The differing intervals can be pre-determined intervals fixed in seconds, or based on a cardiac cycle of the subject. The method can include one or more relaxation period(s) and further inversion-recovery epoch(s) following the last of the plurality of images of step ii) or iv). The one or more water-selective inversion pulses can selectively invert water and/or the one or more fat-selective inversion pulses can selectively invert fat over a range of frequencies around a central water frequency, the frequency range being approximately from −210 Hz to +210 Hz, which can be for a 2.89T MRI scanner and can be scaled in proportion to the magnetic field strength on other MRI scanners. The one or more water-selective inversion pulses can selectively invert water and/or the one or more fat-selective inversion pulses can selectively invert fat over a range of $\gamma B_0$ and said range of $\gamma B_0$ can be about minus 100 Hz to about plus 100 Hz. The one or more water-selective inversion pulses can selectively invert water and/or the one or more fat-selective inversion pulses can selectively invert fat over a range of $\gamma B_0$ and said range of $\gamma B_0$ can extend from the frequency mid-way between fat and water ($v_{water}-v_{fat}$)/2 and to at least as far on the other side of the water or fat resonance, respectively. The plurality of images of step iv) can be taken after a fat-selective inversion pulse at a delay time chosen to minimize the fat signal so as to generate an image dominated by water in a driven steady-state $A_w$; and the method can use the driven steady-state water signal $A_w$ to obtain the water T1 map. A fat-selective inversion pulse can be activated after acquisition of the last of the plurality of images of step iv) in a water inversion-recovery epoch and can be followed by one of the plurality of images of step iv) forming a fat-inversion epoch but starting from the driven steady-state; and the method can use signals from the fat-inversion epoch to determine a driven steady-state water signal $A_w$; and use the driven steady-state water signal $A_w$ to obtain the water T1 map. Multiple successive fat-inversion epochs can be used.

In one or more aspects of any one or more of the embodiments as described herein can be in the context of a water-selective inversion recovery pulse sequence, WOLLI. However, similar considerations can apply to water T1 mapping by saturation-recovery. For example, in SASHA, if the broadband saturation pulse can be replaced with a water-selective saturation pulse, then fitting the data with the conventional 3-parameter model [signal (TS)=A−B exp(−TS/T1)] can give a map of the water T1 relaxation times. A suitable "water-selective saturation pulse" can be a pulse train of the water-selective hypergeometric pulses used in WOLLI, following an approach such as that described by Tao et al. (15). For example, a Bloch-simulation of the hypergeometric pulses can be applied. The relative voltages of the water-selective saturation pulses can be selected to achieve negligible Mz for water after the pulse over a range of field strength (B1) and frequency off set (B0) in vivo (for example, in the liver), while also not disturbing Mz for fat.

In any one or more aspects of any one or more of the methods and systems, a water signal can be selectively saturated instead of selectively inverted; the saturation can be followed by a single-shot image; the combination of a water-selective saturation and a single-shot image can be repeated for a plurality of saturation delay times TS; and the resulting saturation-recovery data can be fitted to a 3-parameter model to obtain a water T1 value. The water signal can include a train of successive water-selective saturation pulses applied at a set of reduced voltages, wherein the pulses are not designed to invert the water signal, but instead wherein the net result is to selectively saturate the water magnetization. The combination of water-selective saturation and single-shot image(s) can be gated to a cardiac cycle of the subject.

In an embodiment, a computer implemented method is provided for selective mapping of water T1 relaxation times in a subject comprising: i. activating one or more water-selective pulses that selectively saturate or invert water magnetization in a region of interest in the subject, by at least one computing device, to perform a water-selective experiment; ii. acquiring during the water-selective experiment a plurality of images at differing intervals relative to the beginning of the acquisition to obtain an observed water map; iii. activating one or more fat-selective pulses that selectively saturate or invert fat magnetization in the region of interest in the subject, by at least one computing device, to perform a fat-selective experiment; iv. acquiring during the fat-selective experiment one or more images at differing intervals relative to the beginning of the acquisition to obtain either (a) a fat-suppressed image of water in driven steady-state; or (b) observed fat T1 or T1* and $A_f$ maps; v. determining from the water-selective experiment and the fat-selective experiment the steady-state contribution for water in the images acquired in steps ii) and iv); and vi. correcting, using the steady-state contribution for water determined in step v), the plurality of images to obtain a water T1 map of the region of interest.

In further embodiment, a system is provided that can implement selective mapping of water T1 relaxation times in a subject comprising: at least one computing device; at least one application executable in the computing device, the at least one application comprising logic that: i. activates one or more water-selective pulses that selectively saturate or invert water magnetization in a region of interest in the subject to perform a water-selective experiment; ii. acquires during the water-selective experiment a plurality of images at differing intervals relative to the beginning of the acquisition to obtain an observed water map; iii. activates one or more fat-selective pulses that selectively saturate or invert fat magnetization in the region of interest in the subject to perform a fat-selective experiment; iv. acquires during the fat-selective experiment one or more images at differing intervals relative to the beginning of the acquisition to obtain either (a) a fat-suppressed image of water in driven steady-state; or (b) observed fat T1 or T1* and $A_f$ maps; v. determines from the water-selective experiment and the fat-selective experiment the steady-state contribution for water in the images acquired in steps ii) and iv); and vi. corrects, using the steady-state contribution for water determined in step v), the plurality of images to obtain a water T1 map of the region of interest.

Other systems, methods, features, and advantages of the present disclosure for systems and methods for the selective mapping of water T1 relaxation times, will be or become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

FIGS. 5(a)-(c) depict inversion recovery curves (simulations) for WOLLI, and FIGS. 5(d)-(f) for 3(3)3(3)5 MOLLI. Separate water and fat components are shown, as well as the combined signal with its fitted curve.

FIGS. 11(a) and 11(b) illustrate a summary of results from in vivo scans.

DETAILED DESCRIPTION

Figure 1A:
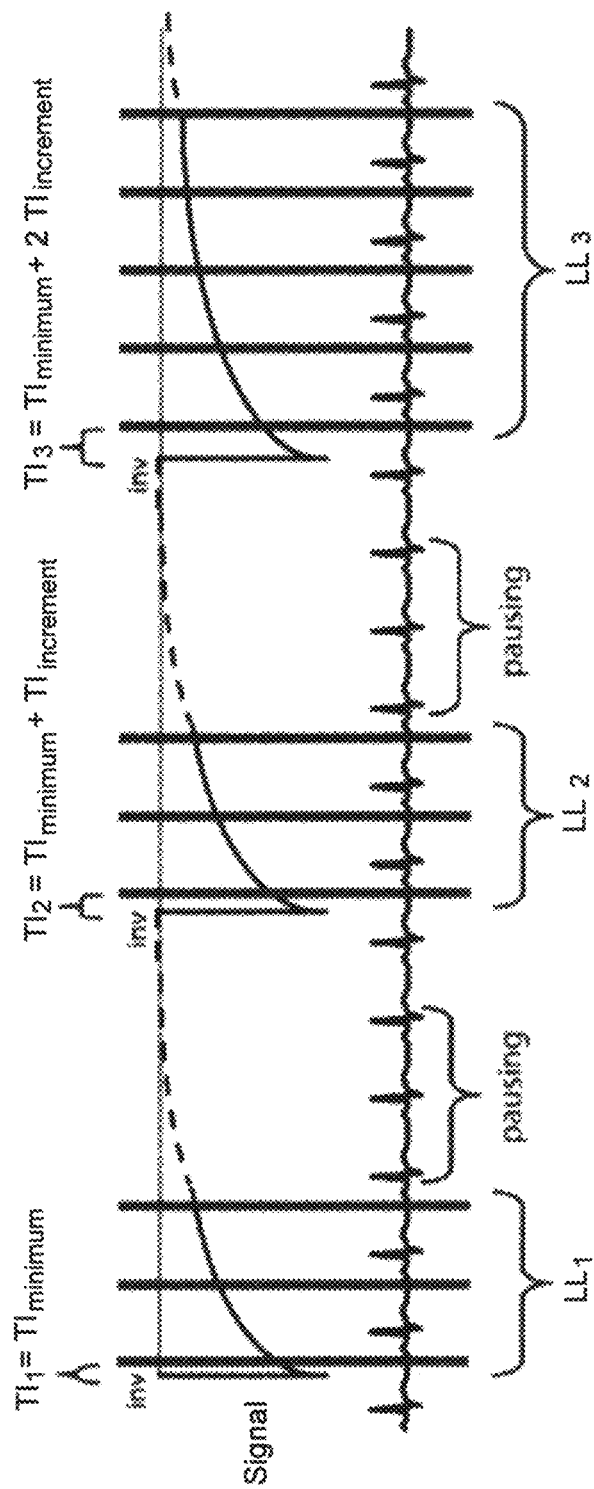
FIG. 1(a) depicts a typical MOLLI pulse sequence.

Described below are various embodiments of the present systems and methods for water-selective Look Locker inversion recovery T1 mapping. Although particular embodiments are described, those embodiments are mere exemplary implementations of the system and method. One skilled in the art will recognize other embodiments are possible. All such embodiments are intended to fall within the scope of this disclosure. Moreover, all references cited herein are intended to be and are hereby incorporated by reference into this disclosure as if fully set forth herein. While the disclosure will now be described in reference to the above drawings, there is no intent to limit it to the embodiment or embodiments disclosed herein. On the contrary, the intent is to cover all alternatives, modifications and equivalents included within the spirit and scope of the disclosure.

Discussion

Before the present disclosure is described in greater detail, it is to be understood that this disclosure is not limited to particular embodiments described, as such may, of course, vary. It is also to be understood that the terminology used herein is for the purpose of describing particular embodiments only, and is not intended to be limiting, since the scope of the present disclosure will be limited only by the appended claims.

Where a range of values is provided, it is understood that each intervening value, to the tenth of the unit of the lower limit (unless the context clearly dictates otherwise), between the upper and lower limit of that range, and any other stated or intervening value in that stated range, is encompassed within the disclosure. The upper and lower limits of these smaller ranges may independently be included in the smaller ranges and are also encompassed within the disclosure, subject to any specifically excluded limit in the stated range. Where the stated range includes one or both of the limits, ranges excluding either or both of those included limits are also included in the disclosure.

Unless defined otherwise, all technical and scientific terms used herein have the same meaning as commonly understood by one of ordinary skill in the art to which this disclosure belongs. Although any methods and materials similar or equivalent to those described herein can also be used in the practice or testing of the present disclosure, the preferred methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present disclosure is not entitled to antedate such publication by virtue of prior disclosure. Further, the dates of publication provided could be different from the actual publication dates that may need to be independently confirmed.

As will be apparent to those of skill in the art upon reading this disclosure, each of the individual embodiments described and illustrated herein has discrete components and features which may be readily separated from or combined with the features of any of the other several embodiments without departing from the scope or spirit of the present disclosure. Any recited method can be carried out in the order of events recited or in any other order that is logically possible.

Embodiments of the present disclosure will employ, unless otherwise indicated, techniques of magnetic resonance physics, computer programming, data analysis, and sample preparation, and the like, which are within the skill of the art. Such techniques are explained fully in the literature.

It is to be understood that, unless otherwise indicated, the present disclosure is not limited to particular types of magnetic resonance apparatus, particular MRI scanner vendors, particular subjects (e.g. human, animal, plant or inanimate), and particular software[s] for post-processing and analysis, or the like, as such can vary. It is also to be understood that the terminology used herein is for purposes of describing particular embodiments only, and is not intended to be limiting. It is also possible in the present disclosure that steps can be executed in different sequence where this is logically possible.

It must be noted that, as used in the specification and the appended claims, the singular forms "a," "an," and "the" include plural referents unless the context clearly dictates otherwise. Thus, for example, reference to "a support" includes a plurality of supports. In this specification and in the claims that follow, reference will be made to a number of terms that shall be defined to have the following meanings unless a contrary intention is apparent.

Description

The present disclosure is directed to methods and systems that can be used to image the T1 relaxation time of water in vivo, which is immune to corruption of the measurement by the presence of fat in the tissue being imaged. Applications of the present disclosure include, but are not limited to, measuring maps of water T1 in the human body using MRI scanners. Exemplary in vivo targets in humans are the liver, heart, spleen, pancreas, blood and/or skeletal muscle. The present method can be applied to tissue subject to magnetic field inhomogeneity, especially in the chest. Measuring maps of water T1 using systems and methods described herein can be done in humans or other species, living or not.

The water T1 signal reflects the tissue microstructure, e.g. it is an indirect measure of the size of cells and the ratio of intracellular to extracellular water. T1 mapping is a growing area, and T1 changes have been associated with many types of disease. In diseased tissue, T1 values can differ from healthy tissue, reflecting edema and fibrosis.

Traditional MR imaging techniques measure a weighted average of the complex-valued signals from any chemical species with $^1$H nuclei present in a given voxel. SSFP images show dramatic changes in both the amplitude and the phase of the steady-state signal with even small amounts of fat in tissue (shown in FIG. 13 for a single SSFP image). In T1 mapping sequences, this means that even small amounts of fat in tissue can have an unexpectedly large deleterious effect on the accuracy of conventional MOLLI, ShMOLLI or SASHA T1 maps, so that they do not measure the T1 of water (as intended), but a signal that can strongly depend on the amount of fat present (illustrated by FIGS. 5(d)-5(f) for MOLLI). (11,12)

Figure 2A:
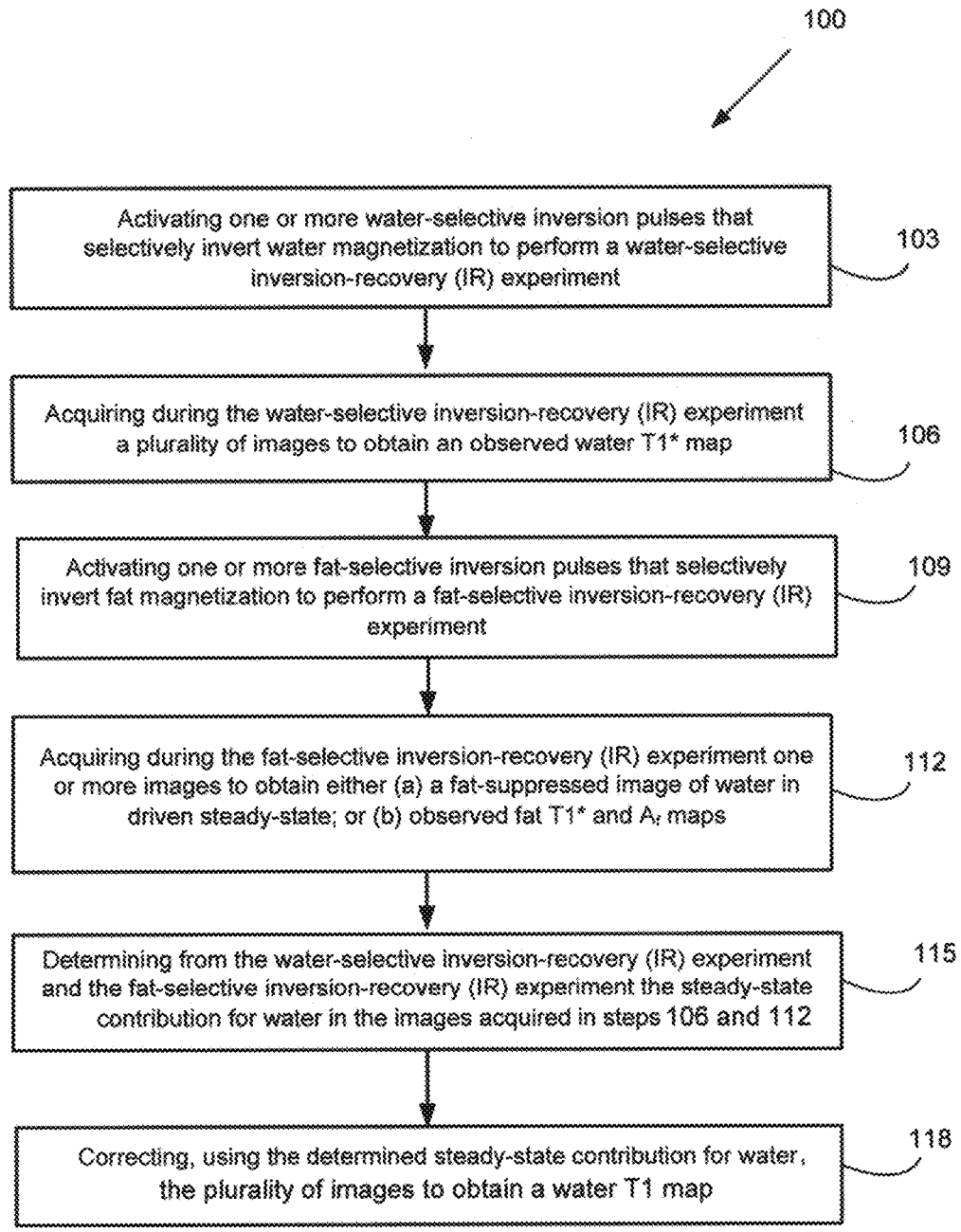
FIGS. 2(a) and (b) flow charts are various methods of the present disclosure.

Described herein is a method for selective mapping of water T1 relaxation times. In an aspect, the method can be computer implemented method, as described in more detail herein. The method can utilize a new pulse sequence that selectively measures the water T1 of tissue, irrespective of the presence of fat. FIG. 2(a) depicts a flow chart of an embodiment of the method 100. First, one or more pulses can be generated or activated 103 that selectively inverts water magnetization to perform a water-selective inversion-recovery (IR) experiment. A series of images at differing intervals relative to the beginning of the acquisition (for example at different delay times (TI)) can be acquired 106 to obtain an observed water T1* map. One or more fat-selective inversion pulses can be activated 109. Either: (a) a pulse sequence to perform fat-suppression, or (b) a pulse sequence to perform a series of one or more fat-selective inversion recoveries can be generated. Both options (a) and (b) above can be activated from the driven steady-state resulting from the water selective inversion recovery epoch. One or more images at differing intervals relative to the beginning of the acquisition (for example at different delay times (TI)) can be acquired 112 to obtain either (a) a fat-suppressed image of water in driven steady-state, or (b) observed fat T1* and $A_f$ maps. The steady-state contribution for water can be determined 115 from the series of images acquired from the water-selective inversion-recovery (IR) experiment and the one or more images acquired from the fat-selective inversion-recovery (IR) experiment. The fat-suppression pulse (option (a) above) can be a fat-selective inversion pulse activated at TI≈ln(2)×T1*f before a final single-shot SSFP readout such that the fat magnetization is (approximately) zero and the water magnetization is at the driven steady-state. Prior knowledge of the (approximate) fat T1* can be used for this approach. Alternatively, if the fat-selective inversion recovery pulse sequence (option (b) above) is used, the water steady-state magnetization can be determined without using a pre-determined fat T1*. Observed water recovery ("water T1*") can then be corrected 118 to extract a true water T1. The steady-state contribution for water determined from the water-selective inversion-recovery (IR) experiment and from the fat-selective inversion-recovery (IR) experiment can be used to obtain a water T1 Optionally, the sequence can be repeated for further inversion epochs (a selective inversion and a set of one or more images) as desired.

Figure 2B:
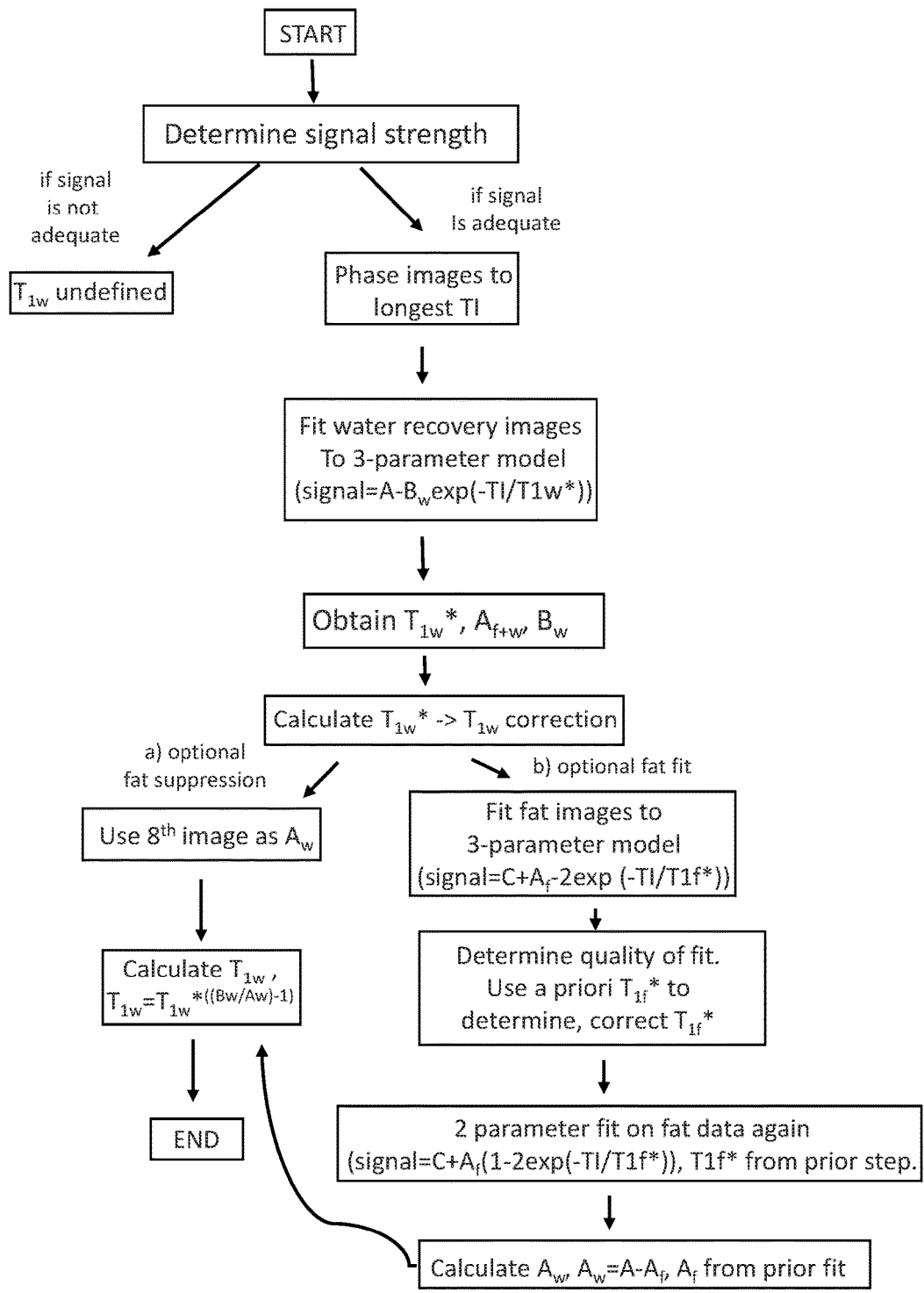

FIG. 2(b) depicts a flow chart of a post-processing embodiment of a method according to the present disclosure. Post-processing of the data can be utilized. In post-processing, the combination of water-selective inversion and knowledge of the steady-state water signal ($A_w$) can allow determination of the T1 of water in each voxel using a modified form of the Deichmann-Haase correction formula (18). These fat-corrected T1 values can be closer (often much closer) to the true water T1 measured by spectroscopy in tissue containing both water and fat, as confirmed in phantoms, normal volunteers, and in patients with fatty liver disease. Other existing methods of fat suppression, such as STIR, SPAIR, STAIR can optionally be used in version (a) of the present methods instead of the chemical-shift selective inversion-recovery (CSS-IR) fat suppression method we have used. These would use similar post-processing to compute the steady-state water signal and hence to generate water-only T1 maps.

The embodiment in FIG. 2(b) shows a first step of determining the signal strength. If the signal is adequate, images are phased to the longest TI. Water recovery images are then fit to a 3-parameter model using the equation signal=$A-B_w\exp(-TI/T1w^*)$ (see, for example Eq. 11 below). As described in the Example below, $T_{1w}^*$, $A_{f+w}$, and $B_w$ can be fixed to the values determined and a $T_{1w}^*$ to $T_{1w}$ correction can be calculated. From here, optional fat suppression can be undertaken and/or an optional fat fit. For fat suppression, following the $T_{1w}^*$ to $T_{1w}$ correction, the 8$^{th}$ image in the series can be used as $A_w$, and $T_{1w}$ can be calculated using $T_{1w}=T_{1w}*((Bw/Aw)-1)$. One or more images can then be reconstructed. For an embodiment of the method using optional fat fit, following $T_{1w}^*$ to $T_{1w}$ correction, fat images can be fit to a 3-parameter model where signal=$C+A_f-2\exp(-T1/T1f)$) and the quality of fit can be determined. A priori T1f* can be used to determine and correct $T_{1f^*}$. A 2-parameter fit can then be done on the fat data again, using the determined and/or corrected T1f*, according to the model signal=$C+A_f(1-2\exp(-T1/T1f^*))$. Aw, $A_w=A-A_f$ and $A_f$ can be calculated from this fit, and $T_{1w}$ can be calculated using $T_{1w}=T_{1w}*((Bw/Aw)-1)$. One or more images can then be reconstructed. More detail on post-processing methods and aspects is provided in the Example and also in Appendices A-C appended hereto.

In an embodiment, the present sequence can adapt the ShMOLLI pulse sequence by using an optimized pulse for the selective inversion of water (for example, a hypergeometric asymmetric inversion pulse). Also included in the method can be a modification of the standard ShMOLLI post-processing to a two-pool model with an unknown amount of water and fat in each voxel. Water T1 can then be extracted using the data collected above.

The water-selective inversion pulse is designed to invert the water in the subject (or sample), leaving the fat spins undisturbed (or nearly so). Thus, when a series of single-shot steady-state free precession images is recorded, these images can show a progression of amplitudes (and changes in phase) which reflect the longitudinal T1 relaxation of water back to the driven steady-state equilibrium. Each of these images can also contain in each voxel an additive contribution from any fat in the voxel, which can be effectively constant across the second and subsequent images. By acquiring a final fat-suppressed image, correction for the contribution of fat to the driven steady-state signal (Af) is possible, which enables the use for example of a variant of the Deichmann-Haase formula to correct for readout-induced partial saturation effects on the observed water T1 recovery ("T1*") to give a true water T1 ("T1w" or "water T1").

This method can work when voxels contain two substances (e.g., fat and water) which are reasonably well separated in chemical shift (i.e., to allow selectivity in the water-selective inversion pulse). The species do not have to be fat and water. This method can work where one species has a T1 that is shorter than the gap between successive single-shot images in a Look-Locker experiment (this allows the quickly relaxing pool to reach steady-state so its contributions can be corrected with the fat-suppressed image).

The frequency-selective inversion pulses can be asymmetric inversion pulses or pulses that have an asymmetric frequency profile, such as hypergeometric pulses (14), or numerically optimized pulses such as Shinnar-Le Roux (SLR) pulses (16), or optimal control pulses (17). The inversion pulse[s] can be designed to operate within a target range of frequency offsets ($B_0$) or RF transmit field strength ($B_1$). The pulses can be designed to operate above a specified RF transmit field strength ($B_1$) minimum threshold (the "adiabatic onset").

In one or more aspects, the pulse[s] described herein can reach an inversion efficiency (IE=$M^+_z/M^-_z$) of about −1.00 over a range of frequency offsets large enough to cover water (or fat) in the target tissue. A pulse is sought with a sharp transition width between inversion (in the passband, covering e.g. water) and negligible effects (in the stopband, covering e.g. the fat methylene peak). The target tissue water can be at frequency offsets relative to the system reference frequency for water in the range (0−Δ$B_0$, 0+Δ$B_0$ Hz) and fat can be (420−Δ$B_0$, 420+Δ$B_0$ Hz) assuming a 420 Hz difference in resonance frequency between water and fat (methylene or —$CH_2$—) peaks in a 3T scanner (26). These frequencies will vary according to the magnetic field strength of the MRI scanner used for imaging and it would be apparent to one skilled in the art to vary the methods described herein for suitable application to a given magnetic field strength in a MRI scanner. The $B_0$-offset $\Delta B_0$ can be about half of the absolute value of the difference between the resonance frequencies of fat and water, and that difference can vary as a function of a field strength. For example, the $B_0$ offset can be about 210 Hz if a 3T scanner is used (i.e. the fat-water separation of 420 Hz/2=210 Hz). An offset such as this is suitable for imaging the human heart or liver.

The offset can be altered and tailored to a specific target organ. The pulse can cover a wide range of $B_0$. The water inversion pulse can take into account the chemical shift for fat and not touch the fat. The pulse can be insensitive to the applied RF transmit field strength ($B_1$). The range of off-resonance frequencies $\Delta B_0$ over which a particular selective-inversion pulse is suitable for WOLLI can be estimated as the frequency range over which the pulse produces a difference of magnetization after the pulse of ~2 $M_0$ between pure water and pure fat, where $M_0$ is the equilibrium magnetization of pure water or pure fat in this calculation. In other words, it can be, for example, the range of frequencies over which the water inversion efficiency is approximately $-1.00$ and the fat inversion efficiency is approximately $+1.00$.

The timing of the pulse sequence or elements within the pulse sequence can be variable. The pulse sequence can be gated to an electrocardiogram (ECG) and timed to a subject's heartbeat, or gated with a pulse oximeter, or run with fixed timings, or gated by other methods available on the MRI scanner being used. The pulse sequence can be gated to a respiratory cycle of a subject. The fat-suppressed image can be taken at a delay time following the fat inversion pulse that corresponds to the time it takes for the longitudinal fat magnetization to relax to about Mz=0. The present pulse sequence can be optionally coupled to other MR experimentation, including but not limited to, MOLLI, ShMOLLI, SASHA, and other MR experiments with or without contrasting agents.

Figure 1B:
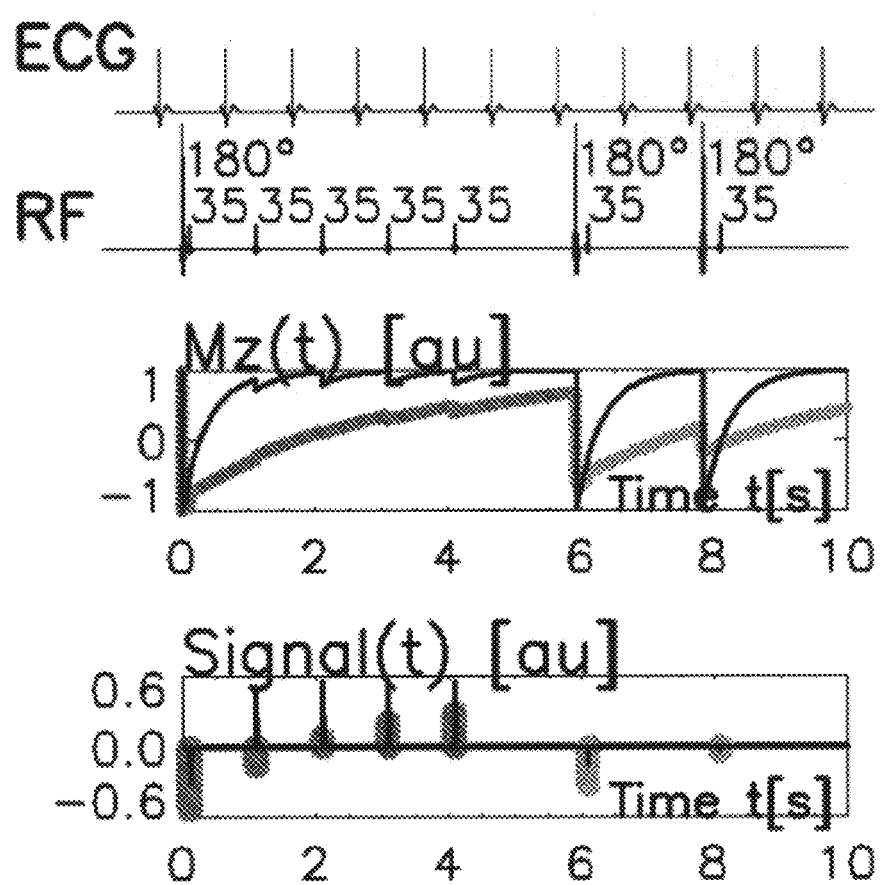
FIG. 1(b) depicts a typical ShMOLLI sequence.

T1 mapping in the heart can be achieved by using a MOLLI, ShMOLLI or SASHA inversion pulse sequence (or with many other sequences). During MOLLI, or ShMOLLI, a Look-Locker inversion recovery with single-shot SSFP readouts all at the same point in cardiac cycle can be used. Images at 11 points can be taken along a recovery curve in one breath hold. Typical examples of MOLLI and ShMOLLI experiments are shown in FIG. 1(a) and FIG. 1(b), respectively. The ShMOLLI pulse sequence is described in more detail in U.S. Pat. No. 9,285,446, which is incorporated as if fully set forth herein.

In-vivo, two main sources of $^1$H MRI signal are fat and water. Problems arise from a partial volume effect with fat and water. Between individual pulses within the SSFP imaging sequence, due to chemical shift, water and fat will precess by different amounts. The signal in each voxel for the methods described herein can be complex-valued quantities, which are the weighted sum of the complex contributions from water and fat in a given voxel. Therefore the magnitudes of the SSFP signal may appear as either a sum, or a difference, or something between those, of the pure water and pure fat SSFP signals.

If the repetition time TR is 1/(chemical shift in Hz), in an SSFP pulse sequence the steady-state fat and water signals will be exactly out of phase. Therefore, for certain fat fractions at 0 Hz off-resonance, the water and fat signals will cancel and it becomes impossible to fit a T1 recovery curve (this occurs for ShMOLLI and MOLLI at typically 40-60% fat fraction). Common intuition would have suggested that MOLLI or ShMOLLI T1 values would resemble a weighted average of the water and fat T1 values in each voxel, but this is not necessarily true (see FIG. 15). Fat T1 is not believed to be of particular diagnostic use in vivo. WOLLI determines fat T1 or T1* incidentally in order to determine the water T1 which is of particular diagnostic use. (Although WOLLI could trivially be adapted to focus on the fat T1 instead of the water T1.)

Figure 3A:
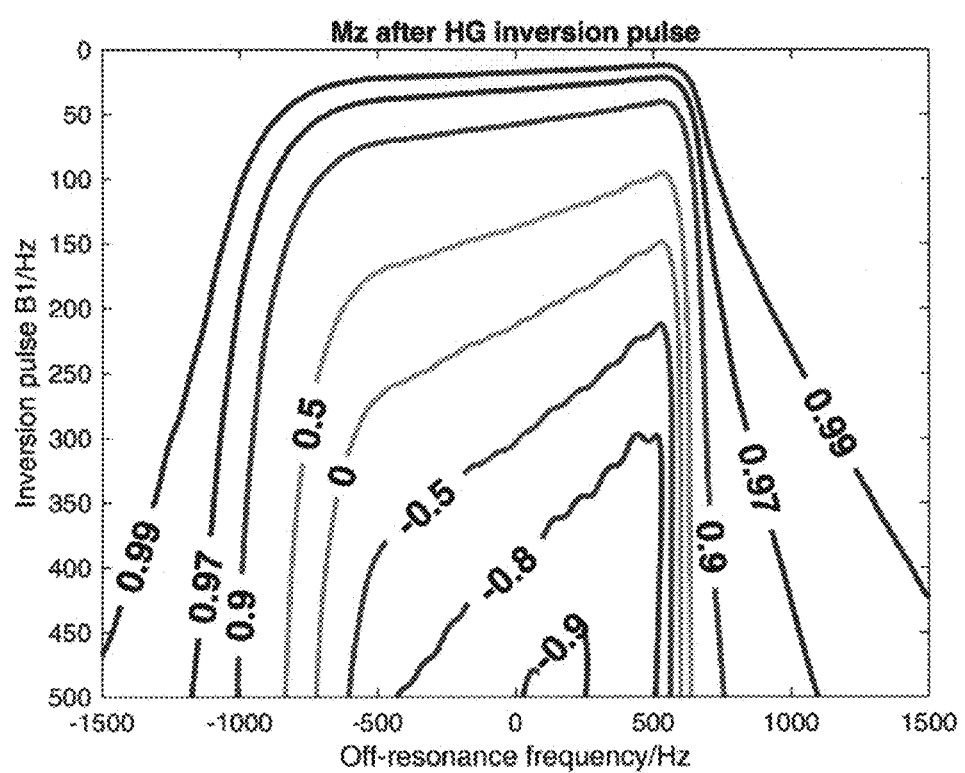
FIG. 3(a) shows a simulated hypergeometric (HG) pulse profile contour plot. Mz is plotted as a function of $\gamma \times B1/Hz$ and off-resonance frequency/Hz.
Figure 3B:
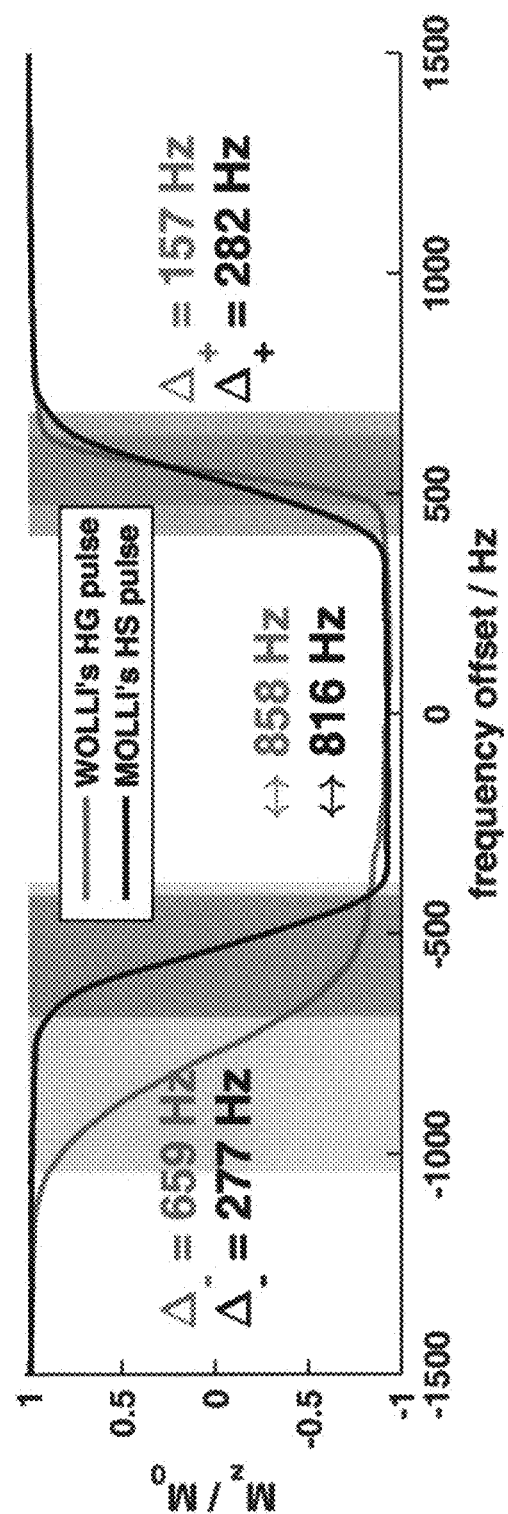
FIG. 3(b) depicts a comparison of a MOLLI hyperbolic sequent (HS) pulse to a WOLLI hypergeometric (HG) pulse.
Figure 7:
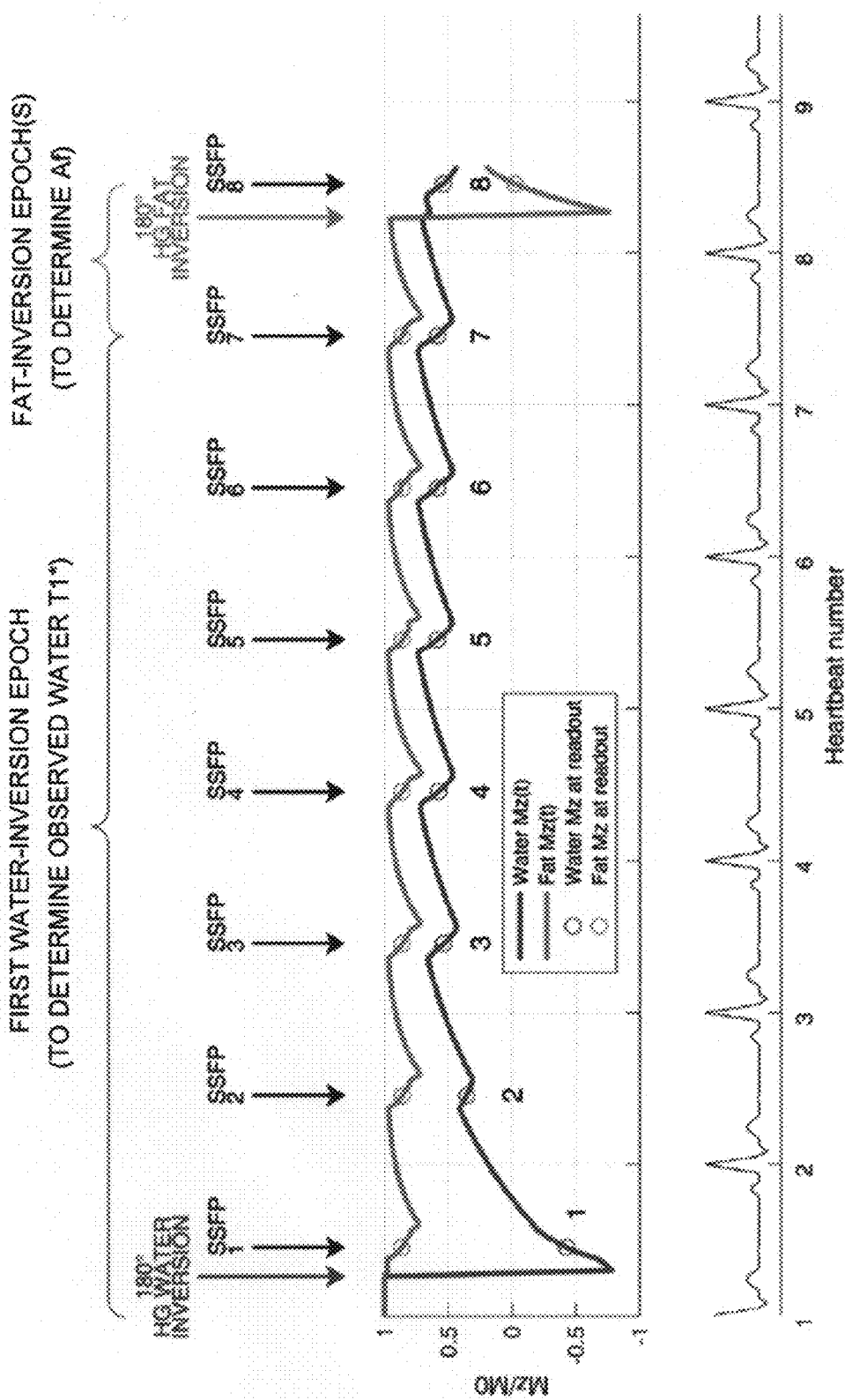
FIG. 7 depicts a WOLLI sequence using one fat suppression image to directly measure Aw.
Figure 8A:
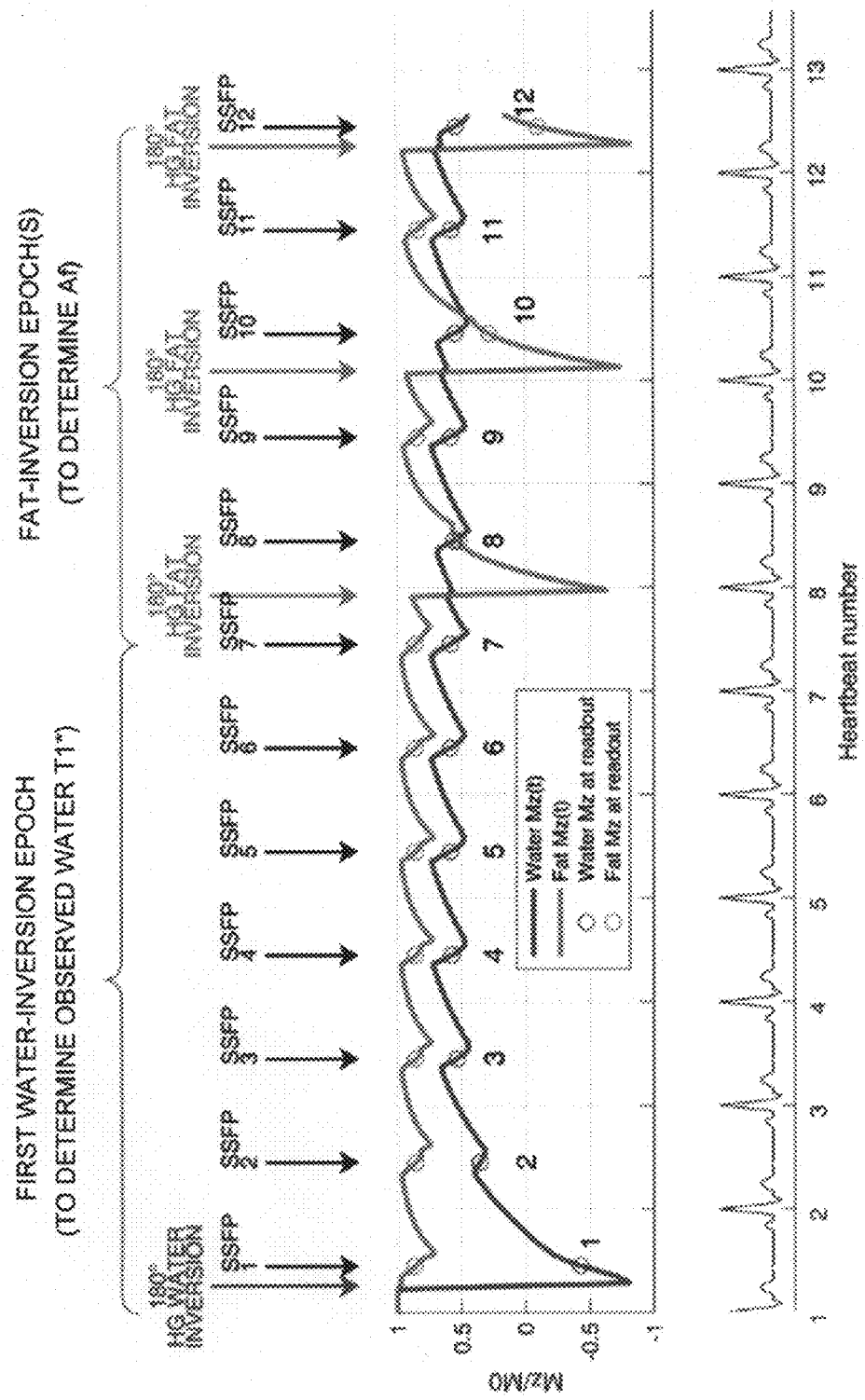
FIG. 8(a) shows an example of a WOLLI pulse sequence with fat fitting.

The present methods can use, for example, hypergeometric (HG) adiabatic pulses to selectively invert water spins and observe their recovery curve. Examples of simulated HG pulse profile contour plots are shown in FIG. 3(a). However, SSFP images taken after a water-only inversion pulse are not water selective and so they also can contain signals from fat as it approaches the driven steady-state from its equilibrium magnetization. Correction for these contaminating effects of fat is needed. In an embodiment, WOLLI achieves this by acquiring either: (a) an additional fat-suppressed image at the end of a water-inversion epoch; or (b) performing a series of fat-selective inversion-recovery epochs immediately following a water inversion-recovery epoch. By both approaches, our present methods can estimate the driven steady-state fat signal and effectively subtracts this from the water-inversion epoch SSFP images to enable accurate computation of the water T1. Their application in WOLLI is illustrated in FIGS. 7 and 8(a). A comparison of WOLLI's HG pulse to MOLLI's HS pulse is depicted in FIG. 3(b). FIG. 3(b) is a 1D slice through FIG. 3(a). It shows how the HG pulse can be better than the HS pulse for selective inversion because of its sharp pass band.

The present methods can take many forms. In an aspect, a water-specific inversion pulse, 3 or more SSFP readouts can be taken at intervals as described herein. A fat-suppressed image can be acquired by activating a fat-only asymmetric inversion pulse followed by one or more SSFP readouts taken after a delay as described herein. The method can take place during a single breath-hold. The fat-only asymmetric inversion pulse and subsequent readout[s] described herein can be substituted for another fat-suppression technique, such as STIR, SPAIR or STAIR. If the T1 time for fat relaxation to Mz=0 is known following a fat selective inversion pulse, a single SSFP readout can be taken after a delay corresponding to that time, i.e. the method of chemical-shift selective inversion-recovery (CSS-IR) fat suppression. If the fat T1* relaxation time is unknown, a series of fat-selective inversions and SSFP readouts can be taken from which the fat T1* can be fitted and then used to correct the effects of the fat signal on the water-selective inversion epoch(s) to determine the true water T1.

Figure 13:
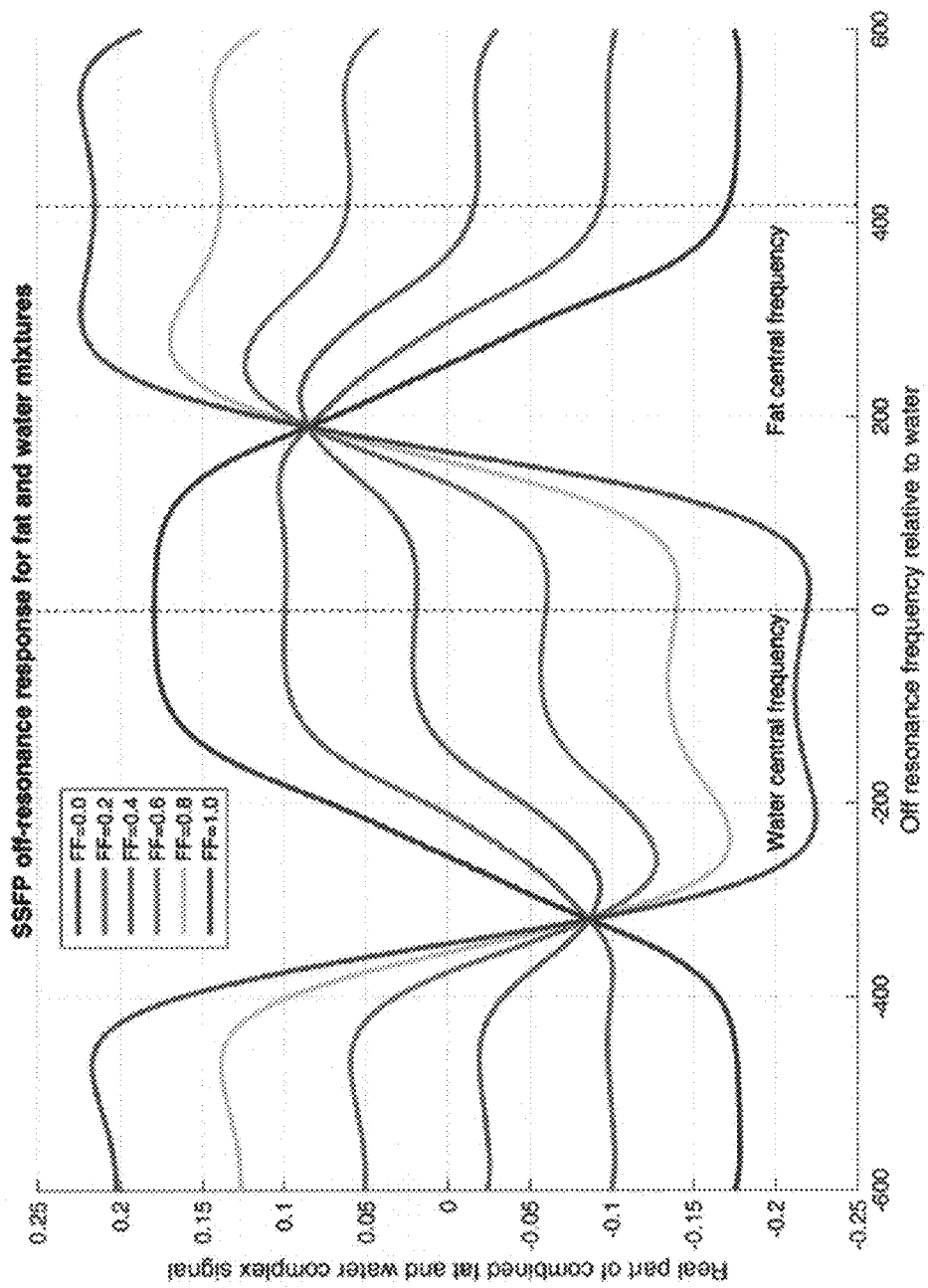
FIG. 13 illustrates variation of SSFP signal for off-resonance frequencies relative to water (the "SSFP profile") at different fat fractions.
Figure 14A:
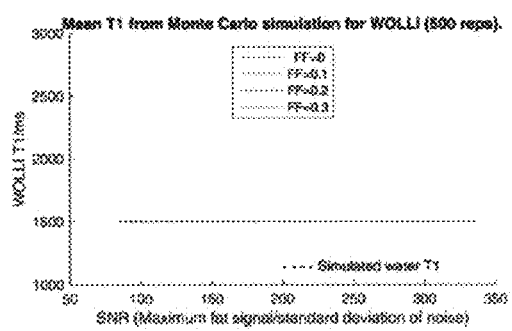
FIGS. 14(a)-(d) show WOLLI (a,b top) and MOLLI (c, d bottom) Monte Carlo simulations to assess the accuracy and precision of the methods as a function of the signal-to-noise ratio of the SSFP images. Simulations were performed for 4 different fat fractions.
Figure 14B:
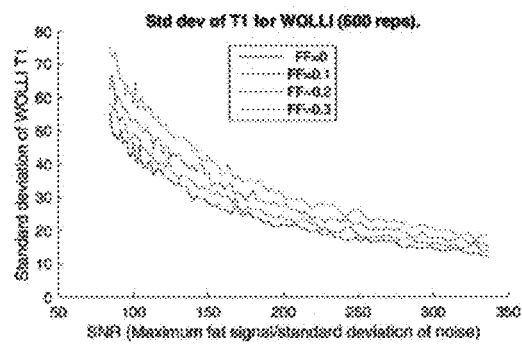
Figure 14C:
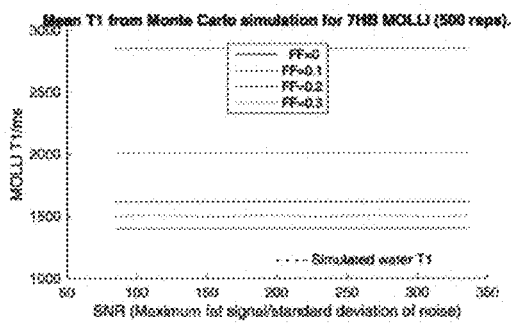
Figure 14D:
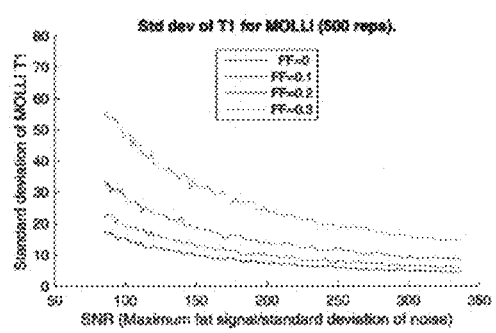

Examples of representative WOLLI pulse diagrams of the present disclosure are shown in FIGS. 7 and 8(a). In these examples, the liver can be imaged. HG water (HGw) represents the water-selective inversion pulse. HG Fat (HGf) represents the fat-selective inversion pulse. The observed signal is the complex sum of the water pool signal (blue line) and the fat pool signal (green line). The phase of fat relative to water will vary approximately as shown in FIG. 13. The recovery phase in heartbeats 9-10 and the subsequent inversion epoch(s) in heartbeats 11-15 are optional. If the first water-inversion epoch (i.e., heartbeats 1-7 here) is considered, a signal can fit according to Equation 1.

$$\text{Signal} = A_{f+w} - B_w \times \exp(-TI/T_{1w}^*) \quad \text{(Eq. 1)}$$

The driven steady-state SSFP signal in a voxel, $A_{f+w}$, is governed by Equation 2.

$$A_{f+w} = A_w + A_f \text{ (not necessarily in phase)} \quad \text{(Eq. 2)}$$

$A_w$ is the complex-valued SSFP signal from water and $A_f$ is the complex-valued constant SSFP signal from fat. There is a need to find a way of obtaining $A_w$ to correct $T_{1w}^*$ to give the water T1 ($T_{1w}$). In variant (a) of WOLLI, this can be accomplished by inverting fat and taking the readout when longitudinal fat magnetization passes through zero—obtaining an image whose complex pixel values are equal to $A_w$. The true T1 signal of water can then be obtained with Equation 3 (referred to herein as the modified Deichmann-Haase formula):

$$T_{1w} = T_{1w}^* \times (B_w/A_w - 1) \qquad \text{(Eq. 3)}$$

Figure 6:
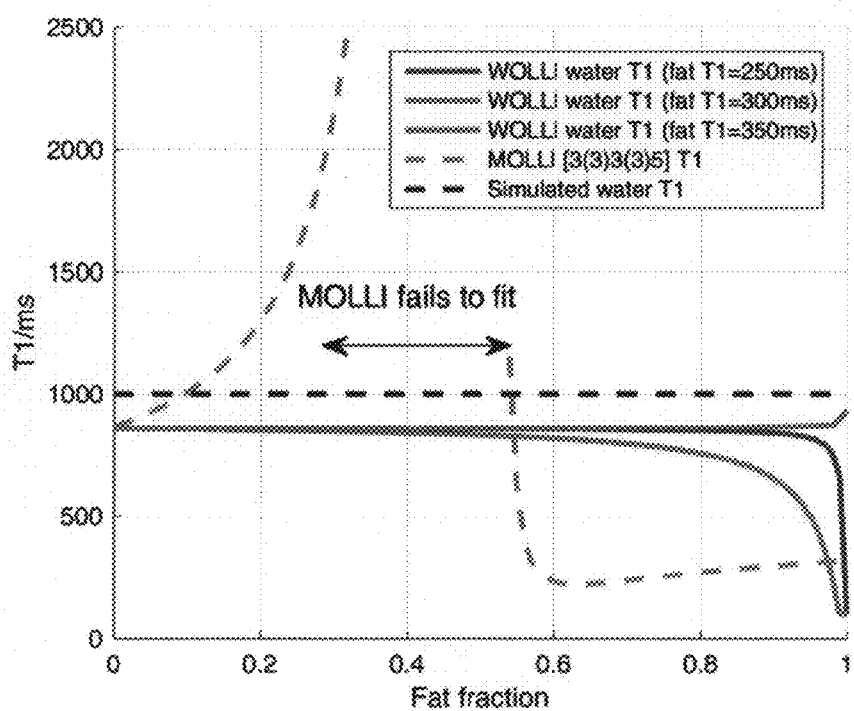
FIG. 6 depicts simulated MOLLI and WOLLI (7w5f) T1 values as a function of fat fraction. The WOLLI sequence was simulated with a range of fat T1s demonstrating it can measure water T1 when fat T1 is relatively unknown.

WOLLI can, thus, allow for the accurate measurement of water T1 in tissue, especially at fat fractions in the range 40-60%, where conventional imaging techniques struggle to fit recovery curves. WOLLI gives these results in an embodiment with breath holds of similar length to ShMOLLI. FIGS. 5(a)-5(f) show the results of simulations demonstrating that whereas MOLLI (in FIGS. 5(d)-5(f)) reports significantly different T1* and T1 values for fat fractions from 0 to 40% (erroneously), WOLLI (in FIGS. 5(a)-5(c)) maintains a practically unchanged T1* and T1 across the range of fat fractions from 0 to 40%. FIG. 6 shows the results of simulations comparing the T1 values reported by MOLLI and WOLLI for fat fractions from 0 to 100% and the true T1. MOLLI shows large errors even for fat fractions as low as 5%. MOLLI can over- or under-estimate the true water T1 (1000 ms here). Whereas WOLLI T1 values vary by less than 5% between 0 and 40% fat fraction. Note that WOLLI has been deliberately tuned here to replicate the well-known underestimation of the true T1 at 0% fat fraction by MOLLI to facilitate a comparison between the methods. Note also that MOLLI fails to fit a T1 value at all for fat fractions between 40 and 60%.

Figure 9:
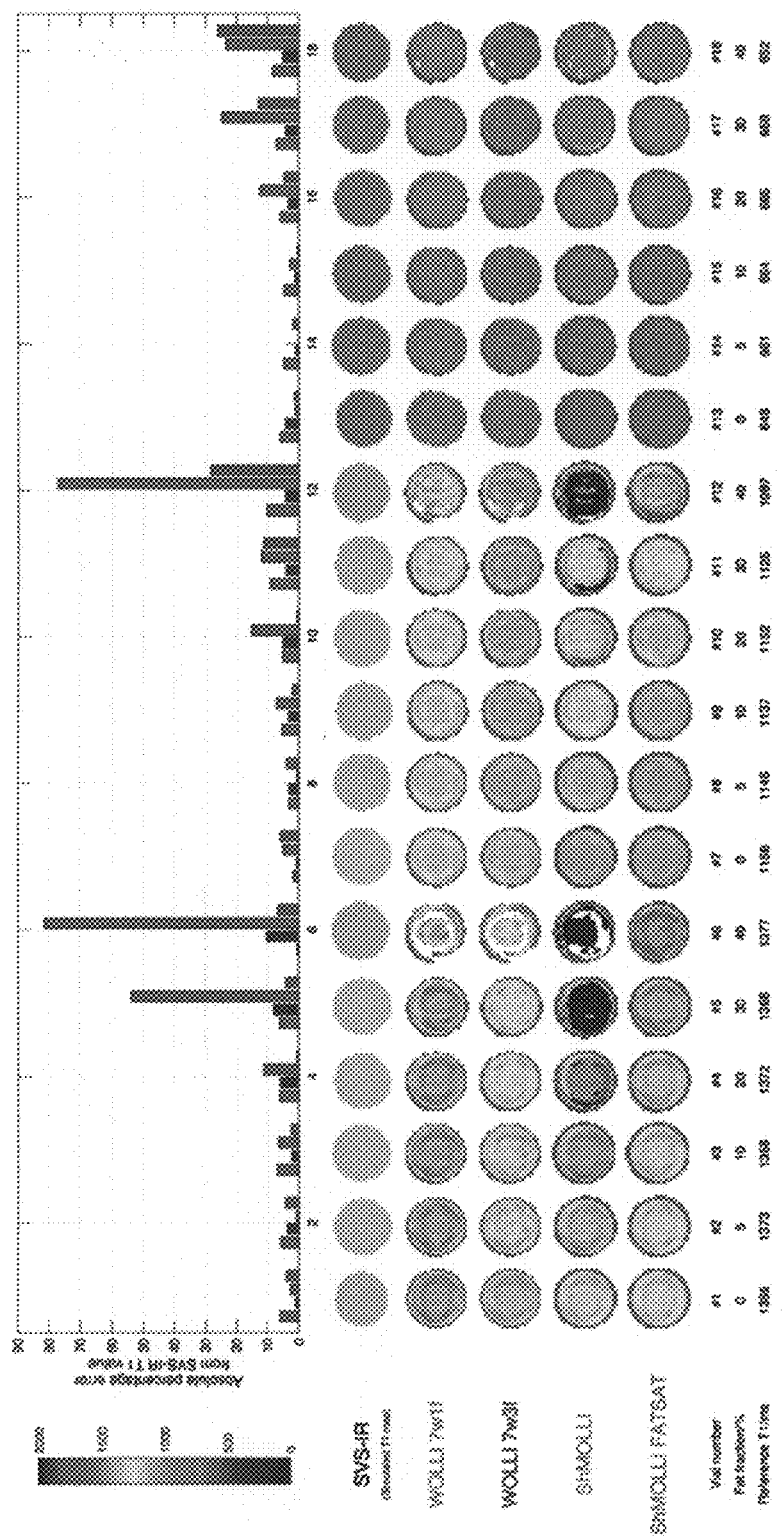
FIG. 9 shows results from phantom experiments.
Figure 10A:
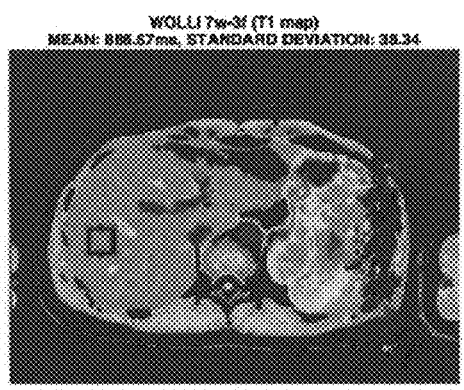
FIGS. 10(a)-10(d) depict an example of in vivo T1 maps, and FIG. 10(e) a spectroscopy inversion recovery. A B0 artefact at the top of the WOLLI images can be seen due to it being outside the shim volume.
Figure 10B:
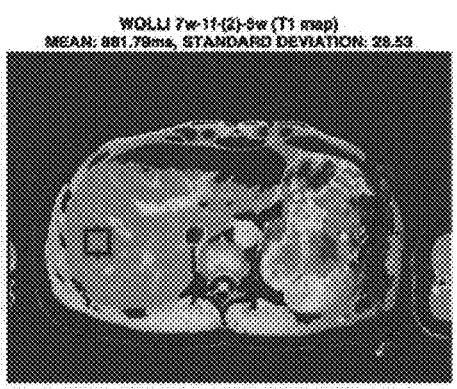
Figure 10C:
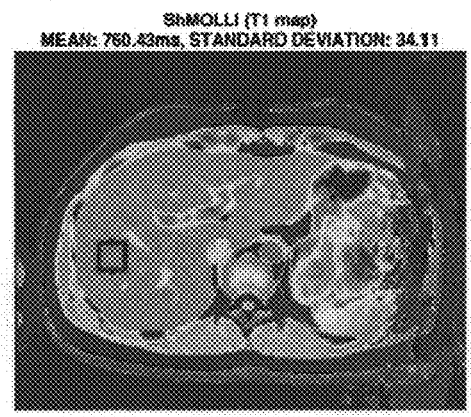
Figure 10D:
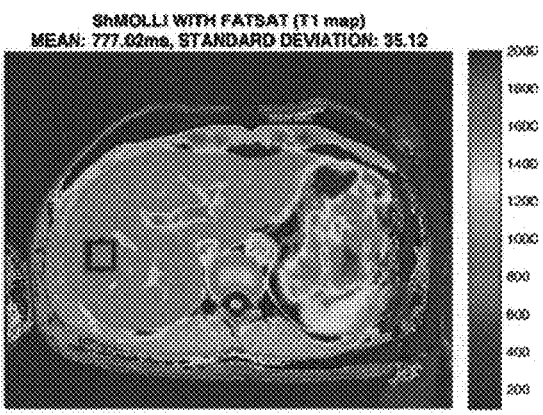
Figure 10E:
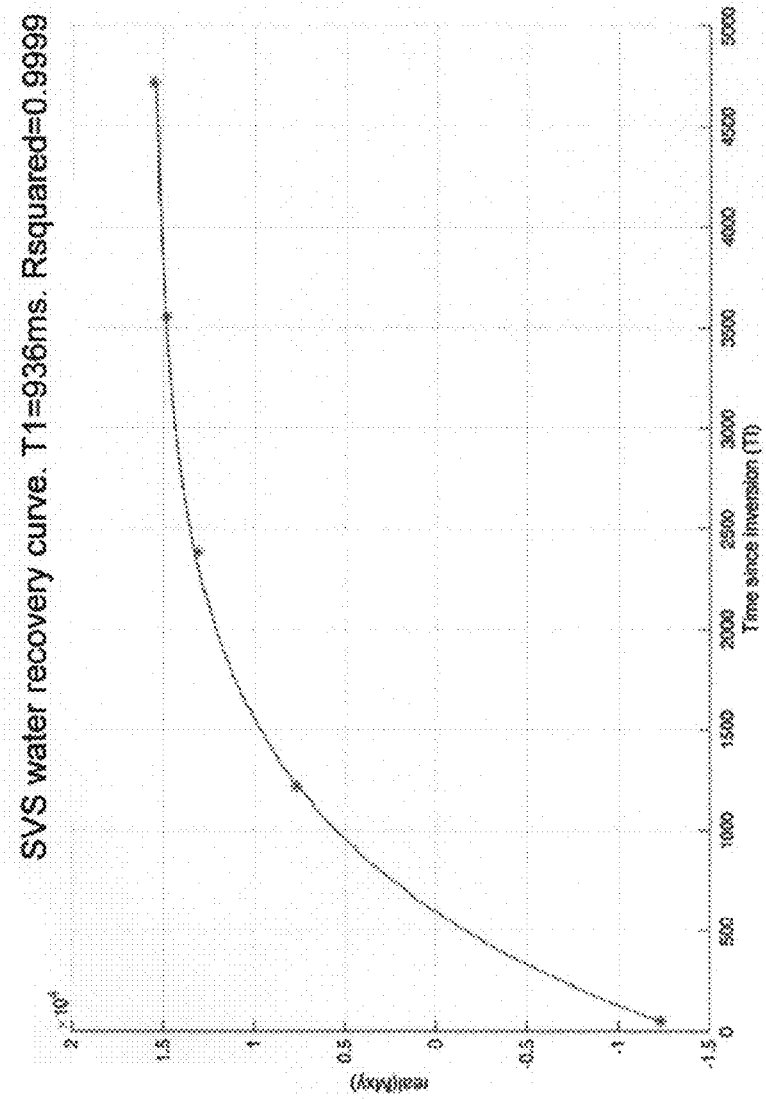

FIGS. 7 and 8(a) illustrate the (a) and (b) variants of WOLLI. FIG. 9 shows the results of phantom validation of WOLLI, compared to ShMOLLI and ShMOLLI with additional "FatSat" fat suppression pulses added before each readout in an attempt to reduce the influence of the fat signal on the ShMOLLI T1 value. Notice that WOLLI T1 values show errors (relative to single-voxel spectroscopy inversion-recovery as a reference) of less than 10% across all tubes tested, whereas ShMOLLI and ShMOLLI with FatSat has errors up to 80% in the worst cases. FIGS. 10(a)-(d) show WOLLI and ShMOLLI comparing T1 maps recorded by the different methods for the same transverse slice through the liver of a volunteer. FIG. 10(e) shows the results of a single-voxel spectroscopy inversion-recovery experiment in the liver (targeted at the tissue in the square box marked in FIGS. 10(a)-(d)). Notice that WOLLI T1 values differ by 49 ms and 54 ms, whereas the MOLLI T1 values differ by 176 ms and 159 ms. WOLLI is therefore more accurate than MOLLI. FIGS. 11(a) and (b) summarize similar analysis to that in FIGS. 10(a)-(d) for a group of 6 subjects (volunteers and liver disease subjects).

Figure 8B:
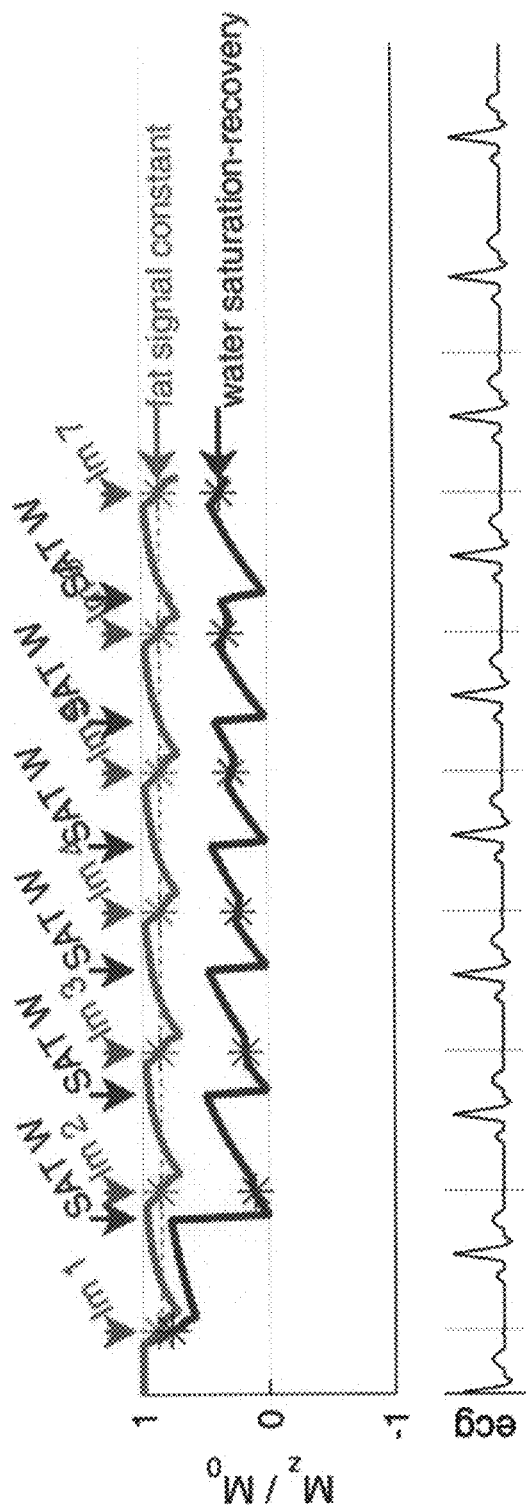
FIG. 8(b) is an example of a water-saturation pulse sequence.
Figure 8C:
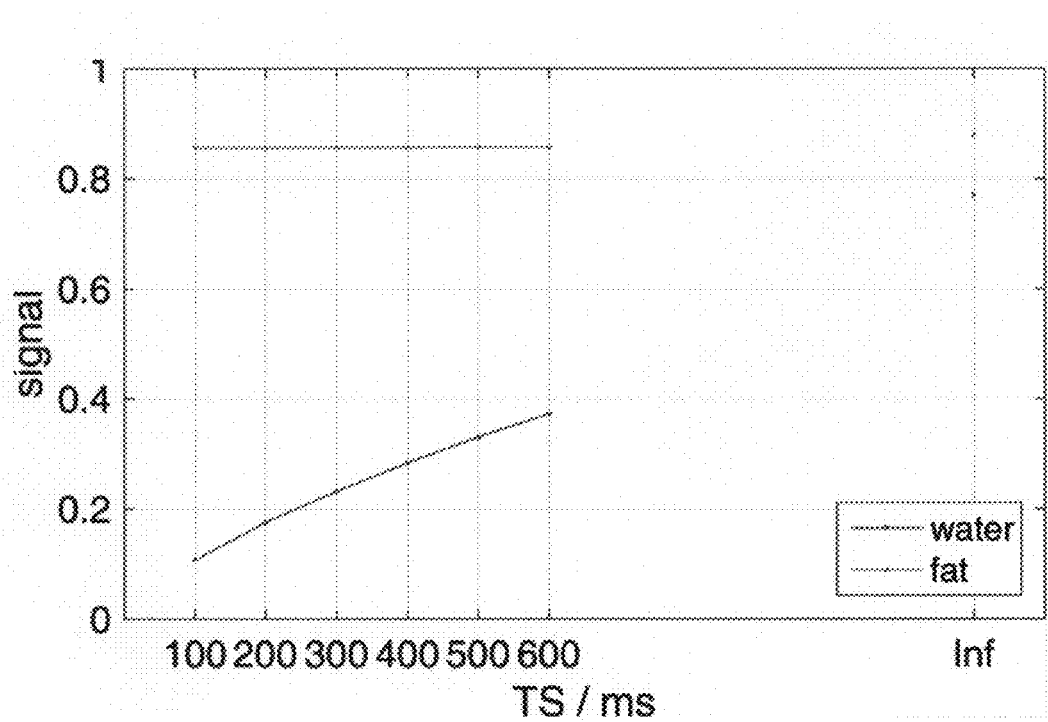
FIG. 8(c) is an example of water-saturation data that could be run through a parameter fit.

As noted above, water-saturation recovery can be used in place of water-inversion recovery. In water-saturation recovery a series of water-saturation pulses can be activated. In saturation-recovery there is only one readout after each saturation pulse to get T1w. An example of a water-saturation pulse sequence is depicted in FIG. 8(b). A 3-parameter fit can be applied to the signal (−TI/T1) (see Eq. 7 below), applying T1 in place of T1* (because the repeated saturation "reset" back to Mz=0 each time). The Second Deichmann-Haase readout-induced saturation step is not needed, unlike with inversion-recovery. Water-saturation recovery can simplify the process because it no longer matters that A and B of the fit equation can contain mixtures of fat and water signals, because A or B are not needed to compute the desired T1. FIG. 8(c) shows water-saturation data that could be run through a 3-parameter fit. One could also apply fat saturation pulses with a readout after each pulse to get T1f as a separate experiment if desired. In practice, even though conceptually these are different expts, it would also be possible to run them back-to-back in a single breath-hold (for example, fat first, to minimize recovery delay).

Further discussion of the present embodiments and additional embodiments and aspects are provided in Appendices A, B and C hereto that are incorporated by reference as if fully set forth herein.

Figure 12:
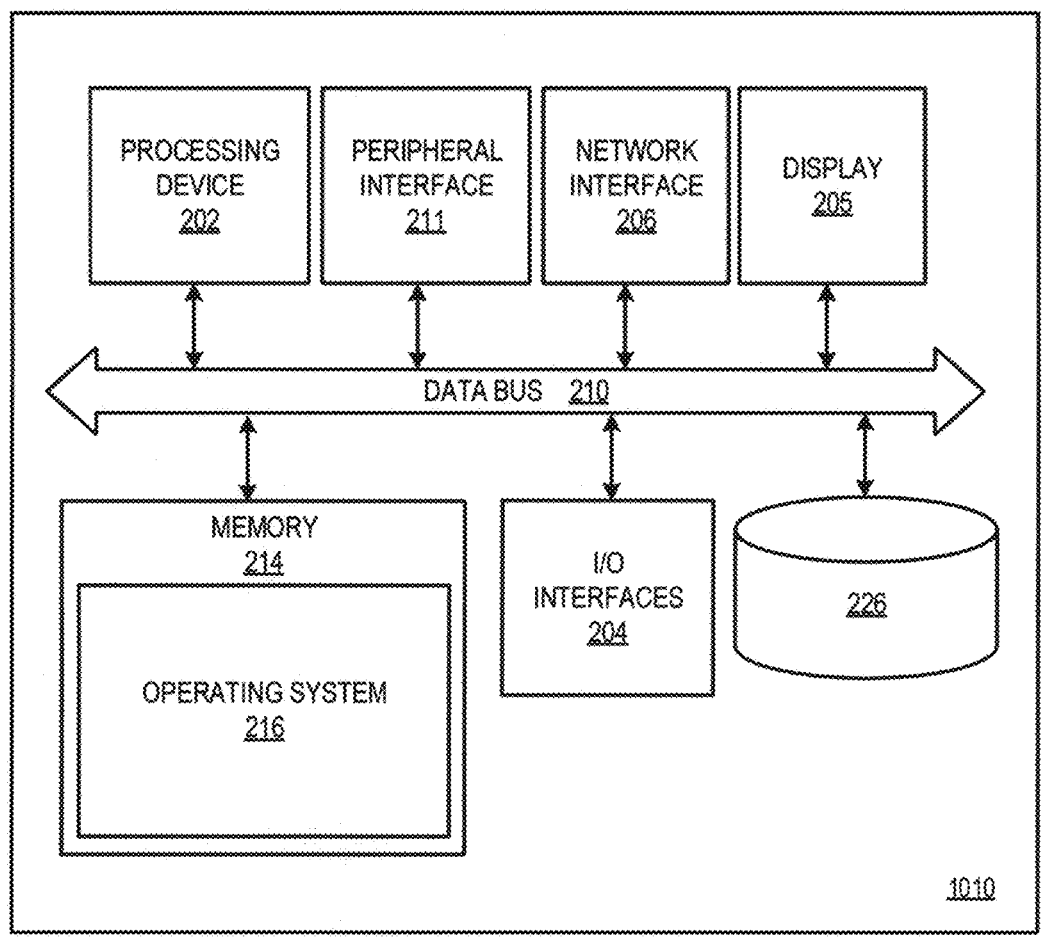
FIG. 12 is a representative system for carrying out the present methods.

FIG. 12, depicts an apparatus 1010 in which the WOLLI technique described herein may be implemented. The apparatus 1010 may be embodied in any one of a wide variety of wired and/or wireless computing devices, multiprocessor computing device, and so forth. As shown in FIG. 12, the apparatus 1010 comprises memory 214, a processing device 202, a number of input/output interfaces 204, a network interface 206, a display 205, a peripheral interface 211, and mass storage 226, wherein each of these devices are connected across a local data bus 210. The apparatus 1010 may be coupled to one or more peripheral measurement devices (not shown) connected to the apparatus 1010 via the peripheral interface 211.

The processing device 202 may include any custom made or commercially available processor, a central processing unit (CPU) or an auxiliary processor among several processors associated with the apparatus 1010, a semiconductor based microprocessor (in the form of a microchip), a macroprocessor, one or more application specific integrated circuits (ASICs), a plurality of suitably configured digital logic gates, and other well-known electrical configurations comprising discrete elements both individually and in various combinations to coordinate the overall operation of the computing system.

The memory 214 can include any one of a combination of volatile memory elements (e.g., random-access memory (RAM, such as DRAM, and SRAM, etc.)) and nonvolatile memory elements (e.g., ROM, hard drive, tape, CDROM, etc.). The memory 214 typically comprises a native operating system 216, one or more native applications, emulation systems, or emulated applications for any of a variety of operating systems and/or emulated hardware platforms, emulated operating systems, etc. For example, the applications may include application specific software which may be configured to perform some or all of the WOLLI technique described herein. In accordance with such embodiments, the application specific software is stored in memory 214 and executed by the processing device 202. One of ordinary skill in the art will appreciate that the memory 214 can, and typically will, comprise other components which have been omitted for purposes of brevity.

Input/output interfaces 204 provide any number of interfaces for the input and output of data. For example, where the apparatus 1010 comprises a personal computer, these components may interface with one or more user input devices 204. The display 205 may comprise a computer monitor, a plasma screen for a PC, a liquid crystal display (LCD) on a hand held device, or other display device.

In the context of this disclosure, a non-transitory computer-readable medium stores programs for use by or in connection with an instruction execution system, apparatus, or device. More specific examples of a computer-readable medium may include by way of example and without limitation: a portable computer diskette, a random access memory (RAM), a read-only memory (ROM), an erasable programmable read-only memory (EPROM, EEPROM, or Flash memory), and a portable compact disc read-only memory (CDROM) (optical).

With further reference to FIG. 12, network interface device 206 comprises various components used to transmit and/or receive data over a network environment. For example, the network interface 206 may include a device that can communicate with both inputs and outputs, for instance, a modulator/demodulator (e.g., a modem), wireless (e.g., radio frequency (RF)) transceiver, a telephonic interface, a bridge, a router, network card, etc.). The apparatus 1010 may communicate with one or more computing devices via the network interface 206 over a network. The apparatus 1010 may further comprise mass storage 226. The peripheral 211 interface supports various interfaces including, but not limited to IEEE-1394 High Performance Serial Bus (Firewire), USB, a serial connection, and a parallel connection.

The apparatus 1010 shown in FIG. 12 may be embodied, for example, as a magnetic resonance apparatus, which includes a processing module or logic for performing conditional data processing, and may be implemented either off-line or directly in a magnetic resonance apparatus. For such embodiments, the apparatus 1010 may be implemented as a multi-channel, multi-coil system with advanced parallel image processing capabilities, and direct implementation makes it possible to generate immediate T1 maps available for viewing immediately after image acquisition, thereby allowing re-acquisition on-the-spot if necessary. One example of an apparatus in which the WOLLI sequence may be implemented is described in U.S. Pat. Nos. 5,993,398 and 6,245,027, which are incorporated by reference as if fully set forth herein.

The flowcharts of FIGS. 2(a) and (b) show an example of functionality that may be implemented in the apparatus 1010 of FIG. 12. If embodied in software, each block shown in FIGS. 2(a) and (b) may represent a module, segment, or portion of code that comprises program instructions to implement the specified logical function(s). The program instructions may be embodied in the form of source code that comprises machine code that comprises numerical instructions recognizable by a suitable execution system such as the processing device 202 (FIG. 12) in a computer system or other system. The machine code may be converted from the source code, etc. If embodied in hardware, each block may represent a circuit or a number of interconnected circuits to implement the specified logical function(s).

Although the flowcharts of FIGS. 2(a) and (b) shows a specific order of execution, it is understood that the order of execution may differ from that which is depicted. For example, the order of execution of two or more blocks may be scrambled relative to the order shown. Also, two or more blocks shown in succession in FIGS. 2(a) and (b) may be executed concurrently or with partial concurrence. Further, in some embodiments, one or more of the blocks shown in FIGS. 2(a) and (b) may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein that comprises software or code can be embodied in any non-transitory computer-readable medium for use by or in connection with an instruction execution system such as, for example, a processing device 202 in a computer system or other system. In this sense, each may comprise, for example, statements including instructions and declarations that can be fetched from the computer-readable medium and executed by the instruction execution system.

The following example is put forth so as to provide those of ordinary skill in the art with a complete disclosure and description of how to perform the methods disclosed and claimed herein. Efforts have been made to ensure accuracy with respect to numbers, but some errors and deviations should be accounted for.

Example

A water-selective Look-Locker inversion recovery (WOLLI) pulse sequence, can be applied to enable water-selective T1 mapping in a single 8 heart-beat breath-hold at 3T. In this example, WOLLI achieves water-selectivity by using an optimized hypergeometric inversion pulse (14) to selectively invert water with negligible effects on fat, and by using a modified form of the Deichmann-Haase partial saturation correction formula (18) to correct the observed water T1* to a true water T1 (i.e. Eq. 3).

Presented herein also is a theory of WOLLI, simulations optimizing its parameters, and a Monte Carlo comparison of its performance against a 7-heartbeat MOLLI sequence for tissue with different fat fractions. WOLLI and ShMOLLI can be validated against reference water $T_1$ values from single voxel spectroscopy in a 19-compartment fat-water mixture phantom, and finally the validation can be repeated in a study of the hearts and livers of healthy volunteers and the livers of fatty-liver-disease patients, for example.

Theory
Hypergeometric Pulses

MOLLI typically uses a hyperbolic secant (HS) adiabatic inversion pulse (19). Typical parameters are pulse duration Tp=10.16 ms, time-bandwidth product R=5.439 and truncation=6.51%, which permit a robust (IE<−0.90) inversion of magnetization over the range of $B_0$ (±300 Hz) and $B_1$ (±50% of nominal), which is more than enough to cover the ranges encountered in the human heart and liver at 3T (20).

Figure 4:
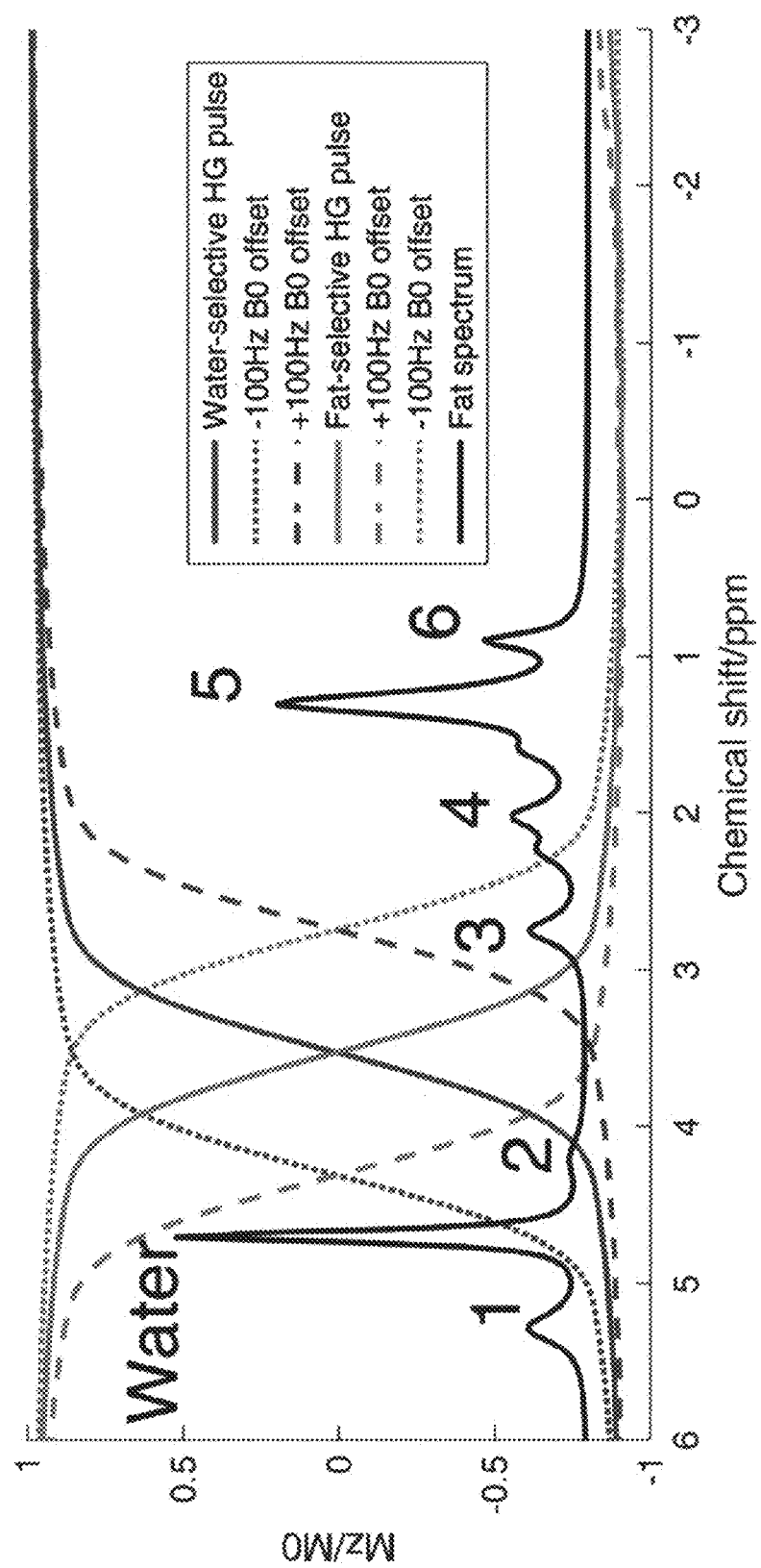
FIG. 4 illustrates simulated HG fat and water selective pulses overlaid on the fat and water spectrum seen in a liver, along with lines to indicate their effect under ±100 Hz $B_0$ offset. Peaks 1-6 are fat resonance peaks, defined according to Hamilton et al. (21).

The principal (methylene, or —$CH_2$—) resonance in liver fat occurs at 1.30 ppm, and the water resonance is at 4.70 ppm (21) (also shown in FIG. 4). On a "3T Trio" scanner (Siemens, Germany), operating at 2.89T, there can therefore be a 420 Hz difference in resonant frequency between these peaks. To achieve selective inversion in the WOLLI sequence, an adiabatic pulse can be used with similar duration, SAR, and adiabatic onset to the MOLLI HS pulse, but which can achieve an inversion efficiency IE=$M_z^+/M_z^-$ ≈−1.00 over the range of frequencies (0−$\Delta B_0$ Hz, 0+$\Delta B_0$ Hz) covering the water resonance, and which can leave IE≈+1.00 for the range of frequencies (420−$\Delta B_0$ Hz, 420+$\Delta B_0$ Hz) covering the fat resonance. In other words, a pulse can have a very sharp transition width between inversion (in the passband, covering water) and negligible effects (in the stopband, covering the fat methylene peak) (FIG. 4).

Rosenfeld et al. (14) introduced the hypergeometric (HG) family of adiabatic pulses defined by:

Hypergeometric pulses (Eq. 4)

$$\omega_x = \omega_1 = \Omega_0 \frac{\sqrt{z(1-z)}}{az+b} \qquad \omega_x = \omega_1 = \Omega_0 \frac{\sqrt{z(1-z)}}{az+b}$$

-continued $$\omega_y = 0 \qquad \omega_y = 0$$

$$\omega_z = \omega - \omega_0 = \frac{cz+d}{az+b} - \omega_0$$

$$\omega_z = \omega - \omega_0 = \frac{cz+d}{az+b} - \omega_0$$

$$t = \ln\frac{z^b}{(1-z)^{a+b}} \qquad t = \ln\frac{z_b}{(1-z)^{a+b}}$$

$$z \in [0, 1] \qquad z \in [0, 1]$$

where a, b, c and d are constants defining the pulse shape. HG pulses are derived from a general solution to the Bloch equations. They include HS pulses as a special case, but in general HG pulses are asymmetric in the time domain and in their frequency-response. The introduction of asymmetry can allow a trade-off between the sharpness of the transition width on the two sides of the pulse. For the present purposes, starting from the classic HS inversion pulse and introducing asymmetry can allow sharpening of the transition width of the pulse on the side between the fat and water resonances. Providing the pulse passband is still sufficiently wide to cover the anticipated range of $B_0$ in vivo, the corresponding increase in the transition width of the far band-edge may be inconsequential. Thus, HG pulses can be used, as described herein, for selective inversion of water and for $T_1$ mapping in vivo.

Steady-State Free Precession Imaging of Fat-Water Mixtures

Look-Locker pulse sequences can record a series of cardiac-gated (e.g. by ECG or pulse-oximeter) single-shot images to sample the recovering magnetization in vivo at the same point in the cardiac cycle over a series of heart beats in a breath hold. This minimizes the effect of cardiac motion, and can enable $T_1$ values to be fitted on a pixel-wise basis. Two-dimensional steady-state free precession (SSFP) imaging is used in MOLLI because it can give a higher signal-to-noise ratio (SNR) and perturbs the $T_1$ recovery less when compared to fast low-angle single shot (FLASH) imaging, although FLASH can be used with appropriate post-processing (23), and many other approaches are possible.

The complex steady-state SSFP signal from a single (fat or water) component is given by (24)

$$M_{SS,xy} = M_0 \frac{(1-E_1)(1-E_2 e^{-i\phi})\sin\alpha}{C\cos\phi + D}, \qquad (Eq.\ 5)$$

where $C=E_2(E_1-1)(1+\cos\alpha)$, $D=(1-E_2\cos\alpha)-(E_1-\cos\alpha)E_2^2$, $E_i=\exp(-T_R/T_i)$.

$M_0$ is the equilibrium magnetisation, $\phi=\gamma B_0$ is the off resonance frequency relative to that component's resonance frequency, and $\alpha$ is the flip angle.

Therefore, in a voxel containing a mixture of water and fat (modelled by its methylene peak alone at this stage), with a proton-density fat fraction $F_f$, the overall SSFP signal in each pixel is:

$$S_{SSFP} = (1-F_f) \times M_{SS,w}(T_{1w}, T_{2w}, \gamma B_0) + F_f \times M_{SS,f} (T_{1f}, T_{2f}, \gamma B_0 - 440 \times 2\pi) \qquad (Eq.\ 6)$$

The typical $T_R$ used for SSFP in the body is ~2.4 ms. As noted by Kellman et al. (11), this means that fat methylene signals (at 1.30 ppm) (21) and water signals (at 4.70 ppm) are, by coincidence, almost of opposite phase for most of the water SSFP pass band. FIG. 13 illustrates this by illustrating the chemical shifts of fat and water, and plotting the SSFP frequency profiles for a range of fat/water mixtures at 3T and shows variation of SSFP signal for off-resonance frequencies relative to water. Signal was allowed to reach the steady state after 300 phase encode lines. The dark blue line is water only and the light blue is fat. Intermediate lines indicate SSFP signal for different fat fractions. Note that for FF=40% on resonance, there is very little signal compared to the individual water and fat pools.

Figure 15A:
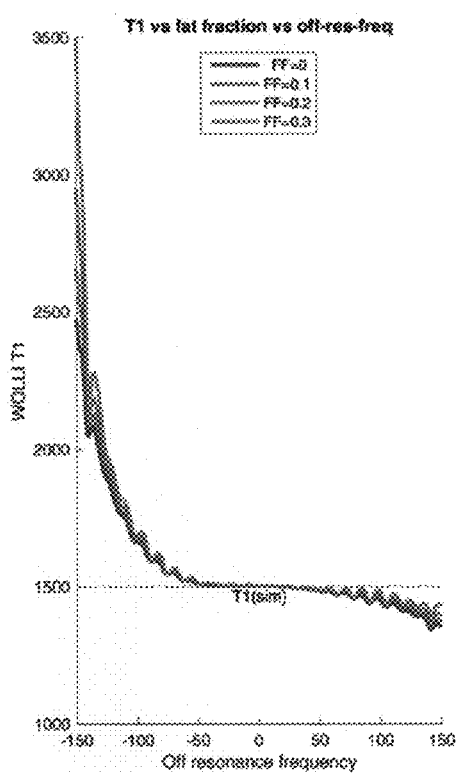
FIGS. 15(a)-(b) demonstrate T1 as a function of off-resonance for WOLLI (left) and ShMOLLI (right), for four fat fractions.
Figure 15B:
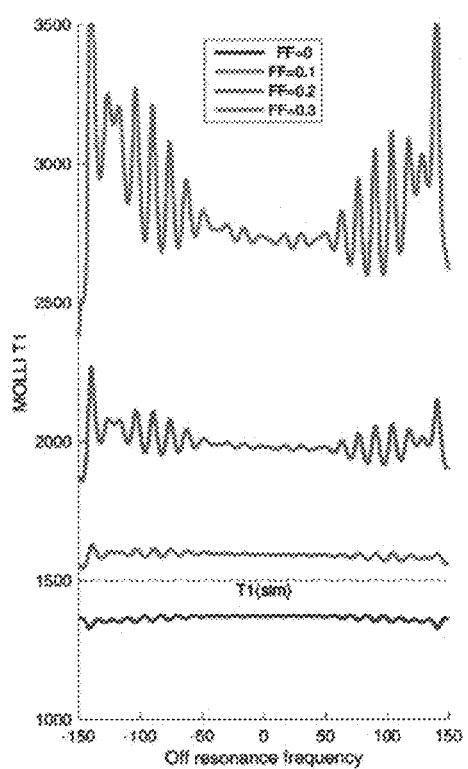
Figure 16B:
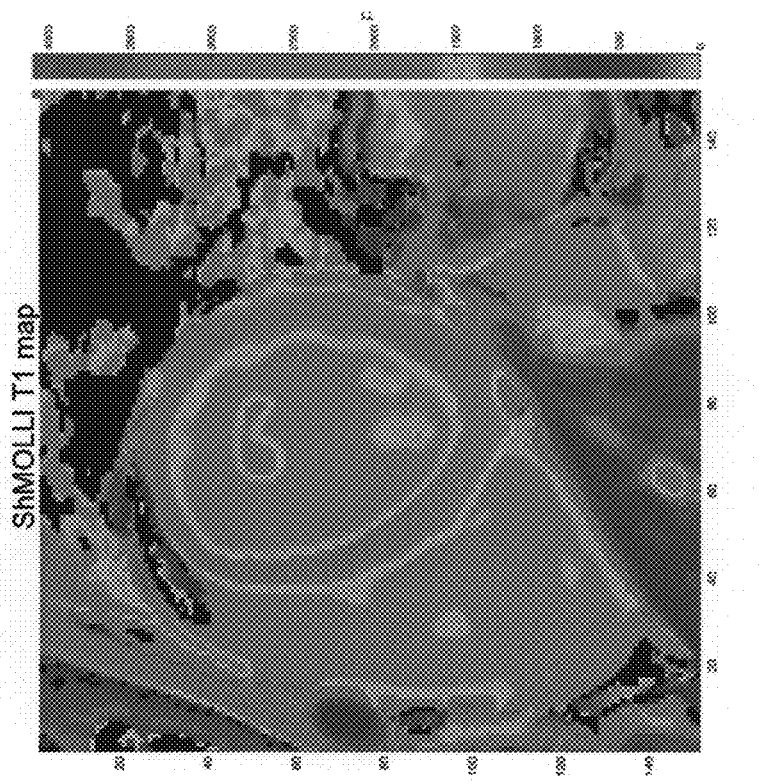
FIGS. 16(a) and 16(b) show WOLLI (a, left) and MOLLI (b, right) in the heart in vivo.
Figure 16A:
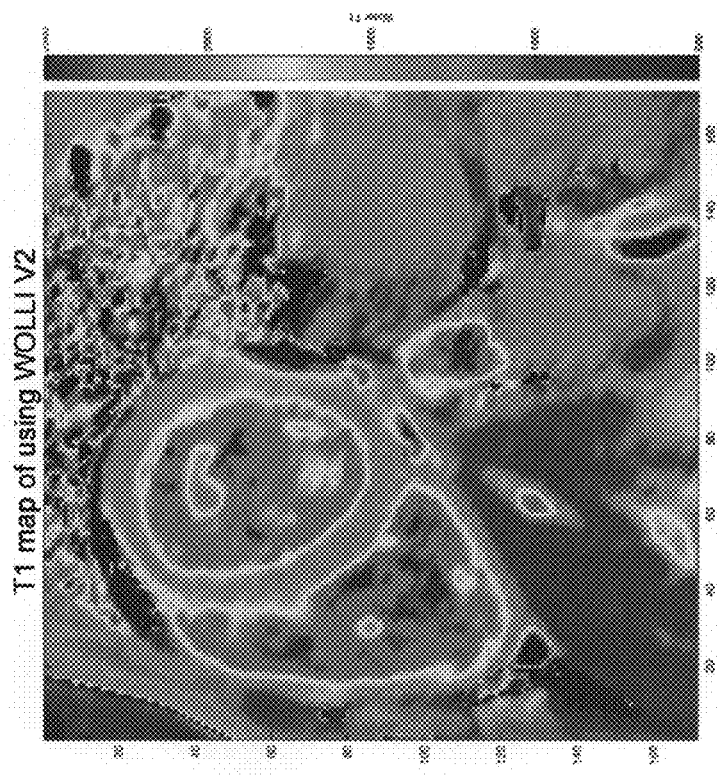

For non-selective inversion recovery (IR) experiments, the phase difference between water and fat SSFP signals means that even in the low-readout flip-angle limit, a three-parameter fit to $$s(T_I) = A - B\exp\left(-\frac{T_I}{T_1^*}\right) \qquad (Eq.\ 7)$$

can give $T_1^*$ values that are greater or less than the true water $T_1$; and so it can cause significant over- or under-estimation of the water $T_1$ by MOLLI or ShMOLLI in voxels containing fat/water mixtures. Furthermore, for fat fractions of ~40-60%, the SSFP signals of fat and water cancel, making it hard to fit the three-parameter model at all. These effects are shown in FIGS. 15(a) and (b), which demonstrate recovery curves for WOLLI and ShMOLLI and the increasing T1 error at intermediate fat fraction[s].

Successive Selective Inversion Recovery

The Deichmann-Haase model of a Look-Locker pulse sequence (18) treats the longitudinal magnetization $M_z$ during a train of equally-spaced identical readouts as approaching exponentially with a time constant $T_1^*$ from its initial value to a driven steady-state A. In systems with multiple non-exchanging pools of magnetization, this model can be applied separately to each pool and sum to give the total observed signal. In other words, the signal from the $k^{th}$ pool is $$\text{Signal}(TI_k) = \alpha_k M_{z,k} = A_k - \underbrace{(A_k - \alpha_k M_{z,k}^+)}_{B_k}\exp\left(-\frac{TI_k}{T_{1k}^*}\right), \qquad (Eq.\ 8)$$

where $TI_k$ is the time since the last interruption of the train of readouts for the $k^{th}$ pool, $\alpha_k$ is a constant of proportionality relating the signal to the longitudinal magnetization $M_{z,k}$ (including coil sensitivity, pool spin density, readout sensitivity via Eq. 5, etc.), $A_k$ is the driven steady-state signal, $M_{z,k}^+$ is the magnetization just after $TI_k=0$, i.e. just after any preparation pulse, and $T^*_{1k}$ is the driven recovery time-constant. Bloch equation simulations of single-shot SSFP pulse sequences with appropriate parameters for applications in the body (not shown) confirm that magnetization recovers according to Eq. 8 with the same $T^*_{1k}$ for any $M_{z,k}^+$.

In MOLLI, ShMOLLI and the first block of WOLLI, the magnetization is initially at equilibrium $M_{0,k}$ and is inverted just before the readout train, so the bracketed term in Eq. 8 can be written $B_k = A_k - \alpha_k\ IE_k\ M_{0k}$ where $IE_k = M^+_{z,k}/M^-_{z,k}$ is the inversion efficiency, i.e. −1 for a perfect inversion and +1 for no inversion at all, and $M^-_{z,k}$ is the magnetization just before the inversion pulse (25). Providing the magnetization is initially at or about equilibrium, Deichmann and Haase's first-order correction formula (15,25) uses $B_k$ to infer the contribution of readout-induced saturation to $A_k$, and hence to compute $$T_{1,k} \approx T^*_{1k}/(A_k/\alpha M_{0k}) = T^*_{1k}\left(1 - \frac{B_k}{A_k}\right)/IE_k. \quad (Eq.\ 9)$$

In WOLLI, frequency-selective inversion can also be performed when the magnetization has reached its driven steady-state, whereupon $\alpha_k M^+_{z,k} = A_k$ $IE_k$, and hence $\overline{B}_k = A_k(1-IE_k)$. The non-inverted pools have $IE_k = +1$ and so $\overline{B}_k = 0$; in other words the system remains unperturbed in the steady state as expected. Meanwhile, the inverted pools have $IE_k = -1$ and so $\overline{B}_k = 2A_k$. Note that since the signal no longer depends on $B_k$, it is not be possible to compute $T_{1k}$ using Eq. 9 from this block.

The core WOLLI protocol, illustrated in FIG. 15(*a*), can comprise (for both options (a) and (b): a water-selective inversion followed by a Look-Locker train of readouts, immediately followed by a set of fat-selective inversion recoveries, with the readout train continuing uninterrupted throughout. Summing Eq. 8 for two pools, fat and water, the total signal in each voxel is $$\text{signal} = \underbrace{A_f - \overbrace{(A_f - \alpha_f M^+_{z,f})}^{\text{"}\overline{B}''_f \text{ or }\text{"}\overline{B}''_f}\exp\left(-\frac{TI_f}{T^*_{1f}}\right)}_{\text{fat}} + \underbrace{A_w - B_w\exp\left(-\frac{TI_w}{T^*_{1w}}\right)}_{\text{water}} \quad (Eq.\ 10)$$

The water pool can follow the normal MOLLI or ShMOLLI 3-parameter model with $TI_w$ counting from the water-inversion pulse onwards. However, the fat pool is more complicated. In the water-selective IR block, the fat "inversion efficiency" $IE_f \approx +1$ (i.e. not inverted) and the initial magnetization $M+_{z,f} \approx +1 \times M_{0f}$ so the bracketed quantity is $\overline{B}_f \approx A_f - \alpha_f M_{0f}$. This reflects the drop in fat signal amplitude as it is driven into the steady-state. In the immediately ensuing fat-selective IR blocks, the fat inversion efficiency $IE_f \approx -1$ (i.e. completely inverted) and the initial magnetization $M+_{z,f} \approx -1 \times A_f/\alpha_f$ because fat is already in the steady-state and so the bracketed quantity $\overline{B}_f \approx 2A_f$. In total, six parameters can be fitted from the WOLLI data: $A_f$, $A_w$, $\alpha M^-_{0f}$, $\alpha M^-_{0w}$, $T^*_{1f}$, $T^*_{1w}$ using the known $TI_f$, $TI_w$, and $IE_{m,n}$ (i.e. the inversion efficiency in the $m^{th}$ pool when the $n^{th}$ pool is targeted). This can be achieved using "lsqcurvefit" from the Matlab Optimization Toolbox. However, the convergence of this fit can be made considerably faster and more robust by performing it in stages as described below. Finally, $T_{1w} \approx T^*_{1w}/(A_w/\alpha M_{0w})$ using the first result in Eq. 9.

Bootstrap Fitting Algorithm

Fat in the body has a short $T_{1f} \approx 312 \pm 48$ ms (26). Consider a worst case where the SSFP readout completely saturates the fat signal, so $M_{z,f} = 0$ after the first readout. With a 200 ms readout duration and an 850 ms RR-interval, by the second image, $$M_{z,f}/M_{0,f} = 1 - \exp\left(-\frac{850-200}{312}\right) = 0.992.$$

So fat can reach the driven steady state after one readout.

Step 1: Images 2-7 can be fitted according to:

$$\text{Signal} = A_{f+w} - B_w\exp\left(-\frac{TI_w}{T^*_{1w}}\right). \quad (Eq.\ 11)$$

Note, however, that Eq. 11 is not equivalent to a one-pool model for water in Eq. 8, because the constant term is $A_{f+w} \equiv A_f + A_w$ instead of $A_w$, so water $T_1$ using Eq. 9 cannot yet be computed.

Step 2: Then, in the fat-selective inversion recovery block(s), $\overline{B}_f = 2A_f$ and $T^*_{1f}$ can be fitted to $$\text{Signal} = A_{f+w} - B_w\exp\left(-\frac{TI_w}{T^*_{1w}}\right) - \overline{B}_f\exp\left(-\frac{TI_f}{T^*_{1f}}\right) \quad (Eq.\ 12)$$

with $A_{f+w}$, $B_w$ and $T^*_{1w}$ fixed to the values determined from the water-selective IR block.

Step 3: Eq. 12 is underdetermined when the fat fraction $F_f \to 0$, because the fitting cannot distinguish whether $\overline{B}_f \to 0$ or $T^*_{1f} \to 0$. So to normalize the value of $\overline{B}_f$ prior knowledge $T^*_{1f,PK}$ computed by Bloch simulations with literature $T_1$, $T_2$ and nominal flip angles can be used to update $$T^*_{1f} := \left(\frac{T^*_{1f}}{\Delta T^{*2}_{1f}} + \frac{T^*_{1f,PK}}{\Delta T^{*2}_{1f,PK}}\right) / \left(\frac{1}{\Delta T^{*2}_{1f}} + \frac{1}{\Delta T^{*2}_{1f,PK}}\right). \quad (Eq.\ 13)$$

Step 4: The estimate of $\overline{B}_f$ by linear least squares can be revised in Eq. 12.

Step 5: Optionally, the fitted parameters can be used as the initial value in a non-linear least squares solution of the 6-parameter model. This implicitly uses the fat $A_f$, $T^*_{1f}$ and $IE_f$ to correct for the non-steady-state fat signal in the first image after water-selective inversion.

Step 6: $A_w = A_{f+w} - \overline{B}_f/2$ can be computed and hence used to obtain $$T_{1w} = T^*_{1w}\left(1 - \frac{B_w}{A_w}\right)/IE_w. \quad (Eq.\ 14)$$

Methods

Pulse Optimisation

Starting with HG parameters that resemble closely the hypersecant (HS) pulse in MOLLI and ShMOLLI, a series of Bloch simulations were performed for fat and water of the longitudinal magnetization immediately after the HG pulse $M_{z+}/M_0$ using literature $T_1$ and $T_2$ values for fat and water (26). A sharp transition of the HG pulse between fat and water was placed, and required that $M_{z+,fat} - M_{z+,water} > 1.8$ over a $\pm 100$ Hz $B_0$ range. A grid search was then made to find a suitable pulse for inverting water, referred to as "$HG_w$" below. Conjugating and frequency-shifting this optimized water inversion pulse gave a suitable pulse for inverting fat, referred to as "$HG_f$" below. FIG. 4 shows the frequency profile of these pulses overlaid on a model fat/water spectrum (using parameters from (26)). The selective inversion bandwidth is ~200 Hz, which can be suitable for use in-vivo.

MR Protocols

The WOLLI pulse sequence was implemented on a 3T Trio MR scanner (Siemens Healthcare, Germany), equipped with a 32-channel cardiac coil and a 12-channel body matrix with spine array. The sequence was programmed on a computer such that for each heart-beat, the protocol specified whether there was to be a fat-selective inversion, a water-selective inversion, and/or an SSFP readout. SSFP readouts were ECG-gated with a consistent trigger delay (typically 340 ms, i.e. mid-diastole), and the times of each inversion pulse were adjustable to any time between the R-wave and the start of the readout. Typical parameters readout parameters were: 35° flip angle SSFP with 5 linear ramp-up pulses and 1 half-height ramp-down pulse, TR/TE=2.51 ms/1.05 ms, 1.9×1.9×8.0 mm³ voxel size, 360 mm readout field of view (FoV), 270 mm phase FoV, 8 mm slice thickness, 192×144 acquisition matrix (×2 zero-padded in k-space before analysis), 2×GRAPPA acceleration, 6/8 partial Fourier and adaptive combination.

ShMOLLI: HS inversion (Tp=10.16, R=5.439, truncation=6.51%) was used, with initial TIs of 100, 180 and 260 ms for the three inversion epochs in "5 (1) 1 (1) 1" (Sh)MOLLI (i.e. 5 heart-beats with readout, 1 for recovery, 1 for readout, etc.). (Sh)MOLLI $T_1$ maps were reconstructed online.

WOLLI 7w1f (option (a) above): Water-selective inversion was applied in the first heart-beat, then 7 read-outs with a 100 ms initial TI, then without any recovery interval, fat-selective inversion was applied in the 8$^{th}$ heart-beat at a TI of 218 ms computed so that the fat longitudinal magnetization Mz=0 during this image. This can be summarized as a "W 7 (0) F 1" WOLLI protocol (or "WOLLI 7w1f" hereafter), by analogy with the convention for describing ShMOLLI or MOLLI protocols. The data were exported as a DICOM montage containing the complex, floating-point single-shot images. These were fit offline in Matlab to Eq. 11, using the trust-region reflective algorithm (27,28) in "lsqcurvefit" and $A_w$ was computed from the value of the fat-suppressed image (using Eq. 15).

WOLLI 7w3f (option (b) above): Water-selective inversion was applied in the first heart-beat, then 7 read-outs with a 100 ms initial TI, then without any recovery interval, fat-selective inversion was applied in the 8$^{th}$ heart-beat, followed by 2 read-outs with a 50 ms initial TI, fat-selective inversion in the 10$^{th}$ heart-beat, and one further readout. This can be summarized as a "W 7 (0) F 2 (0) F 1" WOLLI protocol (or "WOLLI 7w3f" hereafter), by analogy with the convention for describing ShMOLLI protocols. The data were exported as a DICOM montage containing the complex, floating-point single-shot images. These were fit offline in Matlab to Eq. 11 (images 1-7) and Eq. 12 using the bootstrap fitting algorithm.

Reference water $T_1$ relaxation times were obtained using inversion recovery stimulated echo acquisition mode (IR-STEAM) single voxel spectroscopy (SVS). Following Zhang et al. (29), TI values of 50, 1218, 2385, 3553, 4720 ms were chosen. STEAM parameters were: 90° flip angle, 2 kHz bandwidth centred around water (4.7 ppm), 20×20×20 mm³ voxel size, 10 ms echo time (TE), 7 ms mixing time (TM), 10s repetition time (TR), no water suppression, 1024 vector size, 1 preparation scan, 1 average, and using the whitened singular value decomposition (WSVD) algorithm for coil combination (30,31). Spectra were fitted using the advanced method for accurate, robust, and efficient spectral fitting (AMARES) (32) in Matlab to obtain complex water peak amplitudes. These were fit to a 3-parameter model [signal=A−B exp(−TI/$T_{1w}$)] using "lsqcurvefit" in Matlab to give reference water $T_1$ values.

Proton density fat fraction (PDFF) was quantified by STEAM spectroscopy as described in (4). Spectra were acquired with water suppression on (TR=2s, 3 averages, manually optimized water suppression factor) and water suppression off (TR=4s, 1 average), with TE=10 ms, and TM=7 ms. Spectra were post-processed offline with AMARES in MATLAB to determine the PDFF.

Simulations

Bloch equation simulations were performed in MATLAB using the exact WOLLI pulse sequence shaped pulses and timings. Simulations were at 2.89T (the field strength of a "3T Trio" MRI scanner), which means the methylene lipid peak was offset by 420 Hz relative to water. To facilitate comparison, we simulated WOLLI-7w1f, WOLLI-7w3f and 7-heartbeat MOLLI (which is the same as the first inversion-recovery epoch in WOLLI, except with a non-selective inversion pulse). Magnetization transfer effects were not considered. Signal intensities were measured at the center of k-space. Simulation parameters were as follows: $T_{1w}$=800 ms, $T_{1f}$=300 ms, $T_{2w}$=40 ms, $T_{2f}$=60 ms.

Monte Carlo simulations were performed with 100,000 repetitions to determine bias and standard deviation of the methods for 11 different noise levels.

Phantom Experiments

A phantom was constructed from a 25 mm diameter×92 mm height polypropylene container, with 2×laser-cut acrylic supports holding 19×30 mL vials containing solutions of ultra-pure water, peanut oil ("fat", Tesco Ltd, UK), agarose (Sigma Aldrich, UK) and $NiCl_2$ (Sigma Aldrich, UK). Chemicals were used as supplied. The vials had $T_1$s of 700 ms, 1100 ms and 1400 ms and proton-density fat fractions 0%, 5%, 10%, 20%, 30%, 40% (3×6=18 vials). A final vial contained pure fat.

WOLLI and ShMOLLI phantom imaging was performed with a simulated RR interval of 900 ms. STEAM-IR spectroscopy was performed with 30s TR and 3 averages, for 14×14×40 mm³ voxels centered in each vial in turn.

In-vivo Studies

To validate WOLLI in-vivo, the livers of healthy volunteers and liver-diseased patients (XX males and XY females) were scanned in the transverse plane with ShMOLLI, ShMOLLI with FatSat pulses before each readout, WOLLI-7w1f, WOLLI-7w3f, STEAM-IR and a STEAM PDFF protocol (33). The liver-diseased patients (6 male and 0 female, age 40.2±15.1 y, weight 90.0±25.1 kg, height 1.74±0.07 m) were all diagnosed with liver disease and were scanned prior to commencement of any treatment.

The study was approved by our institutional research department and the National Research Ethics Service. All patients and volunteers gave informed written consent.

STEAM-IR and STEAM PDFF voxels were placed in the lateral part of the right lobe of the liver, away from major vessels, bile ducts and the edge of the liver, and intersecting the plane of the ShMOLLI and WOLLI imaging slice.

Results

Simulations

FIGS. 5 and 6 show best-fit T1 values in WOLLI and MOLLI Bloch equation simulations across the full range of fat fractions. The deviation in fitted MOLLI T1 from simulated water T1 as a result of increasing fat fraction is consistent with that reported (in considerably more detail) by Mozes et al. (12). Whereas MOLLI (in FIGS. 5(d)-(f)) reports significantly different T1* and T1 values for fat fractions from 0 to 40% (erroneously), WOLLI (in FIGS. 5(a)-5(c)) maintains a practically unchanged T1* and T1 across the range of fat fractions from 0 to 40%. FIG. 6 shows the results of simulations comparing the T1 values reported by MOLLI and WOLLI for fat fractions from 0 to 100% and the true T1. MOLLI shows large errors even for fat fractions as low as 5%. MOLLI can over- or under-estimate the true water T1 (1000 ms here). Whereas WOLLI T1 values vary by less than 5% between 0 and 40% fat fraction. Note that WOLLI has been deliberately tuned here to replicate the well-known underestimation of the true T1 at 0% fat fraction by MOLLI to facilitate a comparison between the methods. Note also that MOLLI fails to fit a T1 value at all for fat fractions between 40 and 60%.

WOLLI T1s can be fitted accurately over a range of off-resonance frequencies of at least (−50 to +50 Hz) as shown in FIG. 15(a). Due to the nature of the asymmetric inversion pulse, the T1-off-resonance frequency profile is asymmetrical. MOLLI best-fit T1s (FIG. 15(b)) are again seen to be modulated by fat.

The results of Monte Carlo simulations are shown in FIGS. 14(a)-(d). Over the 0-30% range of fat fractions (typical tange in-vivo) and with increasing noise, WOLLI T1s were exactly the same as the input water T1 value. MOLLI best-fit T1 values showed no bias with increasing noise. However, as shown in FIGS. 5 and 6 already, best-fit T1s increased with fat fraction. Due to the reliance of WOLLI-7w1f (i.e. option a) T1 calculation on the $8^{th}$ fat saturation image, the standard deviation of best-fit T1 values were on average higher than for MOLLI. However, at high fat fractions (>30%), MOLLI and WOLLI standard deviations were comparable across the full range of SNRs simulated.

Figure 17:
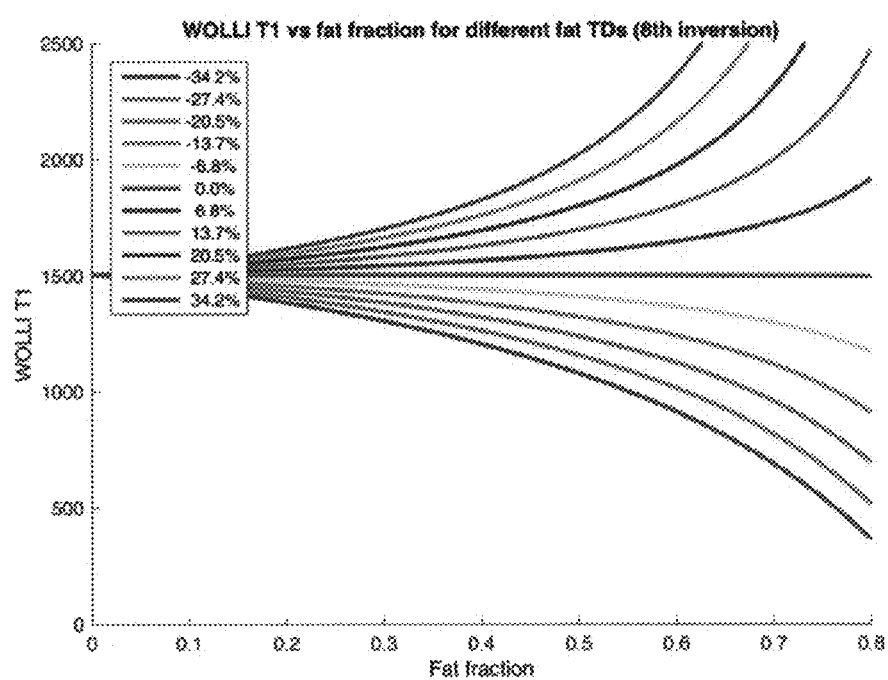
FIG. 17 illustrates the effect of errors in the assumed prior knowledge for the fat T1* on WOLLI T1 (using method (a), a fat-suppressed image) across a range of fat fractions.

WOLLI relies on one or more additional fat-selective inversion recovery block(s) to separate $A_w$ from the combined fat-and-water driven steady-state signal $A_{f+w}$ to obtain $T_1$ via Eq. 9. The effect of uncertainty in the fat T1 on WOLLI-7w1f T1 across a range of fat fractions was investigated. This is equivalent to an uncertainty in the correct fat-suppressing TI for the fat-suppressed image. FIG. 17 shows the results of this in WOLLI-7w1f, with the different lines representing the percentage error in estimated fat T1 and its effect on the water T1 measurement across a wide range of fat fractions. For fat fractions <20%, the effect of up to ±20% uncertainty in the fat T1 has a less than 5% effect on the WOLLI water T1 value, whereas by 20% fat fraction there is already a much larger (30%) effect on MOLLI or ShMOLLI T1 values (as shown in FIG. 6).

Phantom Experiments

FIG. 9 compares T1 values for a variety of fat fractions and water T1 values measured with WOLLI and ShMOLLI to reference values measured by STEAM-IR in the 19-vial phantom (note that the $19^{th}$ vial is pure fat, has no water T1 and is not plotted). WOLLI T1 values differ from the reference values by <10%, whereas (Sh)MOLLI T1 values differ by up to 80%.

In-Vivo Experiments

T1 values can be measured in volunteers and patients (with PDFF ranging from 1-40%) by WOLLI, ShMOLLI, ShMOLLI with FatSat, and STEAM-IR. WOLLI-7w1f T1 values can differ from the reference values by up to 20%, WOLLI-7w3d by up to 35%, ShMOLLI T1 by up to 28%, and ShMOLLI with FatSat T1 values differ by up to 32%.

Discussion

WOLLI gives robust water T1 values in the simulations, phantom and in volunteers and patients with fatty liver disease. According to the phantom results in FIG. 9, if PDFF >5% is suspected in vivo, WOLLI provides a compelling alternative to ShMOLLI or MOLLI. For lower PDFF, WOLLI gives similar results to ShMOLLI or MOLLI but with a somewhat longer breath-hold and a slightly poorer signal-to-noise ratio, so it would be an acceptable, but not optimal choice for such scans. It can be possible to modify WOLLI to be run with similar breath-hold parameters as ShMOLLI or MOLLI.

For patients with fatty liver disease and high fat fractions (>30%), WOLLI can produce T1 maps, when ShMOLLI and MOLLI completely fails to fit to their 3-parameter model. In these patients, it can be challenging to correct ShMOLLI or MOLLI data post-hoc, and the case for scanning with WOLLI is very strong.

Pagano et al. (34) introduced the IDEAL-T1 saturation-recovery pulse sequence. IDEAL-T1 uses a non-selective saturation pulse followed by single-shot DIXON fat-water separated readouts to perform water-specific (readout) saturation-recovery T1 mapping at 1.5T. It can be possible to optimize a hypergeometric pulse for use at 1.5 or 3T and apply a series of these pulses to selectively saturate water (leaving fat at equilibrium) using methods herein described. With conventional SSFP readout, and fitting the standard saturation-recovery 3-parameter model [signal=A−B exp(−TS/$T_1$)], this could give a saturation-recovery variant of WOLLI, which could would operate in a single breathhold (like SASHA non-selective saturation-recovery).

ShMOLLI can quantify a large range of T1 values. A plurality of water inversion epochs in WOLLI may be suitable for measuring very short T1 values. However, because WOLLI can measure only the water T1 value, this means very small values may not be expected (fat in MOLLI and ShMOLLI) to occur in normal and diseased tissue without contrast agents.

The WOLLI sequence can use a single water inversion-recovery epoch or can utilize more than one water inversion-recovery epoch. However, the theory herein would apply equally well to WOLLI if further water inversion-recovery epochs are added at the end of the breathhold (analogous to the approach in ShMOLLI). These could then be used to robustly sample the water T1 recovery even at short T1 times as occur post-contrast. This would enable extracellular volume (ECV) mapping without corruption by the presence of fat. This is not possible with current methodology.

The embodiment of WOLLI outlined in the present example is not intended to be limited or bound by theory, and is by no means the only way to implement water-selective T1 mapping, and different sampling schemes can be developed and tested to optimize and/or improve the range of T1s that can be measured in future work for a given application.

For clarity, WOLLI is described in the present context of a WOLLI-7w1f (or "W 7 (0) F 1" WOLLI) protocol in option a, and WOLLI-7w3f (or "W 7 (0) F 2 (0) F 1" WOLLI) protocol in options b. It is important to note that the WOLLI pulse sequence can be altered and/or run in combination with a great many other protocols, rather like the range of MOLLI protocols that have been applied.

Other Fat-Sat

Known Fat $T^*_{1f}$

In option a, if $T^*_{1f}$ is known (or can be assumed) to vary little between scans, then one could use a single image at $TI_f=\ln 2 \times T^*_{1f}$ in the fat-selective inversion-recovery block. For this image, Eq. 12 would become $$\text{Signal} = A_{f+w} - B_w \exp\left(-\frac{TI_w}{T^*_{1w}}\right) - \frac{B_f}{2} = A_w - B_w \exp\left(-\frac{TI_w}{T^*_{1w}}\right). \quad \text{(Eq. 15)}$$

Since $B_w$ and $T^*_{1w}$ are known from the water-selective inversion-recovery block, Eq. 9 then gives $T_{1w}$. Effectively, the signal in the extra image continues the water inversion-recovery curve, but with an offset because the fat signal is now nulled. This is equivalent to applying chemical-shiftselective inversion-recovery (CSS-IR) fat suppression (13) for the 8$^{th}$ image in WOLLI-7w1f. In principle, Eq. 15 also holds for any other method of fat suppression in the extra image, providing that the water pool T*$_{1w}$ recovery to the driven steady-state is not altered.

CONCLUSIONS

Hypergeometric (HG) adiabatic inversion pulses can be used to disentangle the effects of fat and water in the MOLLI-family of inversion-recovery T$_1$ mapping sequences, exemplified by the WOLLI pulse sequence introduced here. WOLLI can be an important complement to existing approaches that attempt to correct T$_1$ values for the confounding effects of fat using only standard pulse sequences. Simulations show that WOLLI gives water T$_1$ values that are independent of fat fraction and require no prior knowledge of fat T$_1$ or fat fraction.

Ratios, concentrations, amounts, and other numerical data may be expressed in a range format. It is to be understood that such a range format is used for convenience and brevity, and should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1% to about 5%, but also include individual concentrations (e.g., 1%, 2%, 3%, and 4%) and the sub-ranges (e.g., 0.5%, 1.1%, 2.2%, 3.3%, and 4.4%) within the indicated range. In an embodiment, the term "about" can include traditional rounding according to significant figure of the numerical value. In addition, the phrase "about 'x' to 'y'" includes "about 'x' to about 'y'".

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

REFERENCES

1. Ferreira V M, Piechnik S K, Dall'Armellina E, Karamitsos T D, Francis J M, Choudhury R P, Friedrich M G, Robson M D, Neubauer S. Non-contrast T1-mapping detects acute myocardial edema with high diagnostic accuracy: a comparison to T2-weighted cardiovascular magnetic resonance. J. Cardiovasc. Magn. Reson. 2012; 14:42. doi: 10.1186/1532-429X-14-42.
2. Dall'Armellina E, Piechnik S K, Ferreira V M, et al. Cardiovascular magnetic resonance by non contrast T1-mapping allows assessment of severity of injury in acute myocardial infarction. J. Cardiovasc. Magn. Reson. 2012; 14:15. doi: 10.1186/1532-429X-14-15.
3. Bull S, White S K, Piechnik S K, et al. Human non-contrast T1 values and correlation with histology in diffuse fibrosis. Heart 2013; 99:932-937. doi: 10.1136/heartjnl-2012-303052.
4. Banerjee R, Pavlides M, Tunnicliffe E M, et al. Multiparametric magnetic resonance for the non-invasive diagnosis of liver disease. J. Hepatol. 2014; 60:69-77. doi: 10.1016/j.jhep.2013.09.002.
5. Messroghli D R, Radjenovic A, Kozerke S, Higgins D M, Sivananthan M U, Ridgway J P. Modified Look-Locker inversion recovery (MOLLI) for high-resolution T1 mapping of the heart. Magn. Reson. Med. 2004; 52:141-146. doi: 10.1002/mrm.20110.
6. Piechnik S K, Ferreira V M, Dall'Armellina E, Cochlin L E, Greiser A, Neubauer S, Robson M D. Shortened Modified Look-Locker Inversion recovery ((Sh)MOLLI) for clinical myocardial T1-mapping at 1.5 and 3 T within a 9 heartbeat breathhold. J. Cardiovasc. Magn. Reson. 2010; 12:69. doi: 10.1186/1532-429X-12-69.
7. Chow K, Flewitt J a., Green J D, Pagano J J, Friedrich M G, Thompson R B. Saturation recovery single-shot acquisition (SASHA) for myocardial T$_1$ mapping. Magn. Reson. Med. 2014; 71:2082-2095. doi: 10.1002/mrm.24878.
8. Petersen S E, Matthews P M, Francis J M, et al. UK Biobank's cardiovascular magnetic resonance protocol. J. Cardiovasc. Magn. Reson. [Internet] 2016; 18:1-7. doi: 10.1186/s12968-016-0227-4.
9. Takahashi Y, Fukusato T. Histopathology of nonalcoholic fatty liver disease/nonalcoholic steatohepatitis. World J. Gastroenterol. 2014; 20:15539-15548. doi: 10.3748/wjg.v20.i42.15539.
10. Brunt E M, Tiniakos D G. Histopathology of nonalcoholic fatty liver disease. World J. Gastroenterol. 2010; 16:5286-5296. doi: 10.3748/wjg.v16.i42.5286.
11. Kellman P, Bandettini W P, Mancini C, Hammer-Hansen S, Hansen M S, Arai A E. Characterization of myocardial T1-mapping bias caused by intramyocardial fat in inversion recovery and saturation recovery techniques. J. Cardiovasc. Magn. Reson. 2015; 17:33. doi: 10.1186/s12968-015-0136-y.
12. Mozes F E, Tunnicliffe E M, Pavlides M, Robson M D. Influence of Fat on Liver T 1 Measurements Using Modified Look—Locker Inversion Recovery (MOLLI) Methods at 3T. 2016:1-7. doi: 10.1002/jmri.25146.
13. Laurent W M, Bonny J M, Renou J P. Imaging of water and fat fractions in high-field MRI with multiple slice chemical shift-selective inversion recovery. J. Magn. Reson. Imaging [Internet] 2000; 12:488-496. doi: Doi 10.1002/1522-2586(200009)12:3<488::Aid-Jmri15>3.0.Co; 2-5.
14. Rosenfeld D, Panfil S L, Zur Y. Design of adiabatic pulses for fat-suppression using analytic solutions of the Bloch equation. Magn. Reson. Med. 1997; 37:793-801.
15. Tao Y, Hess A T, Keith G A, Rodgers C T, Liu A, Francis J M, Neubauer S, Robson M D. Optimized saturation pulse train for human first-pass myocardial perfusion imaging at 7T. Magn. Reson. Med. 2015; Volume 73, Issue 4, pages 1450-1456.
16. lkonomidou V N, Sergiadis G D. "Improved Shinnar-Le Roux Algorithm". Journal of Magnetic Resonance. 2000; 143 (1): 30-34. doi:10.1006/jmre.1999.1965
17. Li J S, Ruths J, Yu T Y, Arthanan H, Wagner G. Optimal Pulse Design in Quantum Control. Proc Natl Acad Sci USA. 2011 Feb. 1; 108(5): 1879-1884. doi: 10.1073/pnas.1009797108. PMCID: PMC3033291.
18. Deichmann R, Haase a. Quantification of T1 Values by SNAPSHOT-FLASH NMR Imaging. J. Magn. Reson. 1992; 96:608-612. doi: 10.1016/0022-2364(92)90347-A.
19. Kellman P, Herzka D a., Hansen M S. Adiabatic inversion pulses for myocardial T1 mapping. Magn. Reson. Med. 2014; 71:1428-1434. doi: 10.1002/mrm.24793.
20. Sung K, Nayak K S. Design and use of tailored hard-pulse trains for uniformed saturation of myocardium at 3

Tesla. Magn. Reson. Med. [Internet] 2008; 60:997-1002. doi: Doi 10.1002/Mrm.21765.
21. Hamilton G, Yokoo T, Bydder M, Cruite I, Schroeder M E, Sirlin C B, Middleton M S. In vivo characterization of the liver fat 1H MR spectrum. NMR Biomed. 2011; 24:784-790. doi: 10.1002/nbm.1622.
22. Zhu H, Ouwerkerk R, Barker P B. Dual-band water and lipid suppression for MR spectroscopic imaging at 3 Tesla. Magn. Reson. Med. 2010; 63:1486-1492. doi: 10.1002/mrm.22324.
23. Shao J, Rapacchi S, Nguyen K L, Hu P. Myocardial T1 Mapping at 3.0 Tesla Using an Inversion Recovery Spoiled Gradient Echo Readout and Bloch Equation Simulation with Slice Profile Correction (BLESSPC) T1 Estimation Algorithm. J Magn Reson Imaging. 2016 February; 43(2):414-25. doi: 10.1002/jmri.24999. Epub 2015 Jul. 27.
24. Bieri O, Scheffler K. Fundamentals of balanced steady state free precession MRI. J. Magn. Reson. Imaging 2013; 38:2-11. doi: 10.1002/jmri.24163.
25. Rodgers C T, Piechnik S K, DelaBarre L J, Van de Moortele P-F, Snyder C J, Neubauer S, Robson M D, Vaughan J T. Inversion Recovery at 7 T in the Human Myocardium: Measurement of T-1, Inversion Efficiency and B-1(+). Magn. Reson. Med. [Internet] 2013; 70:1038-1046. doi: 10.1002/mrm.24548.
26. Hamilton G, Middleton M S, Hooker J C, Haufe W M, Forbang N I, Allison M a., Loomba R, Sirlin C B. In vivo breath-hold $^1$H MRS simultaneous estimation of liver proton density fat fraction, and $T_1$ and $T_2$ of water and fat, with a multi-TR, multi-TE sequence. J. Magn. Reson. Imaging [Internet] 2015:n/a-n/a. doi: 10.1002/jmri.24946.
27. Coleman T F, Li Y. An Interior Trust Region Approach for Nonlinear Minimization Subject to Bounds. SIAM J. Optim. 1996; 6:418-445. doi: 10.1137/0806023.
28. Coleman T F, Li Y. On the convergence of interior-reflective Newton methods for nonlinear minimization subject to bounds. Math. Program. 1994; 67:189-224. doi: 10.1007/BF01582221.
29. Zhang Y, Yeung H N, O'Donnell M, Carson P L. Determination of sample time for T1 measurement. J. Magn. Reson. Imaging 1998; 8:675-681. doi: 10.1002/jmri.1880080324.
30. Rodgers C T, Robson M D. Receive Array Magnetic Resonance Spectroscopy: Whitened Singular Value Decomposition (WSVD) Gives Optimal Bayesian Solution. Magn. Reson. Med. [Internet] 2010; 63:881-891. doi: 10.1002/mrm.22230.
31. Rodgers C T, Robson M D. Coil combination for receive array spectroscopy: Are data-driven methods superior to methods using computed field maps? Magn. Reson. Med. [Internet] 2015; 00:n/a-n/a. doi: 10.1002/mrm.25618.
32. Vanhamme L, van den Boogaart A, Van Huffel S. Improved method for accurate and efficient quantification of MRS data with use of prior knowledge. J. Magn. Reson. [Internet] 1997; 129:35-43.
33. Rial B, Robson M D, Neubauer S, Schneider J E. Rapid quantification of myocardial lipid content in humans using single breath-hold 1H MRS at 3 Tesla. Magn Reson Med [Internet] 2011; 66:619-624. DOI: 10.1002/mrm.23011.
34. Pagano J, Chow K, Yang R, Thompson R B. Fat-water separated myocardial $T_1$ mapping with IDEAL-$T_1$ saturation recovery gradient echo imaging. J Cardiovasc Magn Reson. 2014; 16(Suppl 1): P65. DOI: 10.1186/1532-429X-16-S1-P65.

Therefore, the following is claimed:

1. A computer implemented method for selective mapping of water T1 relaxation times, is a subject comprising:
  i. activating one or more water-selective inversion pulses that selectively invert water magnetization in a region of interest in the subject, by at least one computing device, to perform a water-selective inversion-recovery (IR) experiment;
  ii. acquiring during the water-selective inversion-recovery (IR) experiment a plurality of images at differing intervals relative to the beginning of the acquisition to obtain an observed water T1* map;
  iii. activating one or more fat-selective inversion pulses that selectively invert fat magnetization in the region of interest in the subject, by at least one computing device, to perform a fat-selective inversion-recovery (IR) experiment;
  iv. acquiring during the fat-selective inversion-recovery (IR) experiment one or more images at differing intervals relative to the beginning of the acquisition to obtain either (a) a fat-suppressed image of water in driven steady-state; or (b) observed fat T1* and $A_f$ maps;
  v. determining from the water-selective inversion-recovery (IR) experiment and the fat-selective inversion-recovery (IR) experiment the steady-state contribution for water in the images acquired in steps ii) and iv); and
  vi. correcting, using the steady-state contribution for water determined in step v), the plurality of images to obtain a water T1 map of the region of interest.

2. The method of claim 1, wherein the water-selective inversion pulse is a pulse with an asymmetric frequency profile, or the fat-selective inversion pulse is a pulse with an asymmetric frequency profile, or both.

3. The method of claim 1, wherein the one or more water-selective inversion pulses include a hypergeometric pulse, an optimal control pulse, or a Shinnar-Le Roux pulse, or the one or more fat-selective inversion pulses include a hypergeometric pulse, an optimal control pulse, or a Shinnar-Le Roux pulse.

4. The method of claim 1, wherein the one or more water-selective inversion pulses that selectively invert water magnetization have negligible effects on fat magnetization, or the one or more fat-selective inversion pulses that selectively invert fat magnetization have negligible effects on water magnetization, or both.

5. The method of claim 1, wherein the one or more images acquired during step ii), or the one or more images acquired during step iv), or both, are one or more single-shot images.

6. The method of claim 5, wherein the one or more single-shot images are single-shot Cartesian SSFP images, Radial SSFP images, Spiral SSFP images, other types of SSFP images, or FLASH images, or EPI images, or other types of single-shot magnetic resonance images.

7. The method of claim 1, wherein one or more of said water-selective inversion pulses have an inversion efficiency of about −0.90 to about −1.00 over a range of frequencies covering the water resonance, or one or more of said fat-selective pulses have an inversion efficiency of about −0.90 to about −1.00 over a range of frequencies covering the fat resonance, or both.

8. The method of claim 1, wherein said one or more water-selective inversion pulses have an inversion efficiency of about −0.90 to about −1.00 over a range of frequencies around the central water resonance frequency ($v_{water}$) covering from $v_{water}-\gamma\Delta B_0$ to $v_{water}+\gamma\Delta B_0$, and said one or more fat-selective inversion pulses have an inversion efficiency of about −0.90 to about −1.00 over a range of frequencies around the central fat resonance frequency ($v_{fat}$) covering from $v_{fat}-\gamma\Delta B_0$ to $v_{fat}+\gamma\Delta B_0$.

9. The method of claim 1, wherein the last of the plurality of images of step iv) is acquired about the time during the fat-selective inversion recovery epoch that the fat longitudinal magnetization relaxes to about Mz=0.

10. The method of claim 1, wherein the differing intervals are pre-determined intervals fixed in seconds, or based on a cardiac cycle of a subject.

11. The method of claim 1, further comprising one or more relaxation period(s) and further inversion-recovery epoch(s) following the last of the plurality of images of step ii) or iv).

12. The method of claim 1, wherein the one or more water-selective inversion pulses selectively invert water and/or the one or more fat-selective inversion pulses selectively invert fat over a range of frequencies around a central water frequency, the frequency range being approximately from −210 Hz to +210 Hz.

13. The method of claim 1, wherein the one or more water-selective inversion pulses selectively invert water and/or the one or more fat-selective inversion pulses selectively invert fat over a range of $\gamma B_0$ and said range of $\gamma B_0$ is about minus 100 Hz to about plus 100 Hz.

14. The method of claim 1, wherein the one or more water-selective inversion pulses selectively invert water and/or the one or more fat-selective inversion pulses selectively invert fat over a range of $\gamma B_0$ and said range of $\gamma B_0$ extends from the frequency mid-way between fat and water ($v_{water}-v_{fat}$)/2 and to at least as far on the other side of the water or fat resonance, respectively.

15. The method of claim 1, wherein the plurality of images of step iv) are taken after a fat-selective inversion pulse at a delay time chosen to minimize the fat signal so as to generate an image dominated by water in a driven steady-state $A_w$; and using the driven steady-state water signal $A_w$ to obtain the water T1 map.

16. The method of claim 1, where a fat-selective inversion pulse is activated after acquisition of the last of the plurality of images of step iv) in a water inversion-recovery epoch and is followed by one of the plurality of images of step iv) forming a fat-inversion epoch but starting from the driven steady-state; and using signals from the fat-inversion epoch to determine a driven steady-state water signal $A_w$; and
using the driven steady-state water signal $A_w$ to obtain the water T1 map.

17. The method of claim 16, wherein multiple successive fat-inversion epochs are used.

18. The method of claim 1, wherein
a water signal is selectively saturated instead of selectively inverted;
the saturation is followed by a single-shot image, forming a combination of a water-selective saturation and a single-shot image, generating saturation-recovery data;
the combination of water-selective saturation and single-shot image is repeated for a plurality of saturation delay times TS; and
wherein the resulting saturation-recovery data are fitted to a 3-parameter model to obtain a water T1 value.

19. The method of claim 18, wherein the water signal includes a train of successive water-selective saturation pulses applied at a set of reduced voltages, wherein the pulses are not designed to invert the water signal, but instead wherein the net result is to selectively saturate the water magnetization.

20. The method of claim 19, wherein the combination of water-selective saturation and single-shot image(s) is gated to a cardiac cycle of the subject.

* * * * *